(12) United States Patent
Mortell et al.

(10) Patent No.: US 7,070,483 B2
(45) Date of Patent: Jul. 4, 2006

(54) AUTOMATED DRILL BIT RE-SHARPENING AND VERIFICATION SYSTEM

(75) Inventors: Paul D Mortell, Eden Prairie, MN (US); Chi Hoang, Tustin, CA (US); David M. McElrone, San Jose, CA (US); Gary P. Erpenbeck, Laguna Hills, CA (US); Walter James Frandsen, Jr., San Diego, CA (US); Charles Shafee Slemon, Encinitas, CA (US)

(73) Assignee: Kycera Tycom Corporation, Irvine, CA (US)

( * ) Notice: Subject to any disclaimer, the term of this patent is extended or adjusted under 35 U.S.C. 154(b) by 386 days.

(21) Appl. No.: 10/135,607

(22) Filed: Apr. 30, 2002
(Under 37 CFR 1.47)

(65) Prior Publication Data
US 2002/0168922 A1 Nov. 14, 2002

Related U.S. Application Data

(60) Division of application No. 09/804,169, filed on Mar. 12, 2001, now Pat. No. 6,517,411, which is a continuation of application No. 09/421,824, filed on Oct. 20, 1999, now Pat. No. 6,283,824, which is a continuation-in-part of application No. 09/082,590, filed on May 21, 1998, now Pat. No. 6,030,276.

(51) Int. Cl.
*B24B 1/00* (2006.01)
*B24B 51/00* (2006.01)
*B24B 49/00* (2006.01)

(52) U.S. Cl. .............................. 451/48; 451/6; 451/339

(58) Field of Classification Search .................. 408/11, 408/13, 1 R; 451/6, 5, 8, 48, 54, 67, 331, 451/339, 461

See application file for complete search history.

(56) References Cited

U.S. PATENT DOCUMENTS

| 3,828,480 | A | * | 8/1974 | Weng | 451/201 |
|---|---|---|---|---|---|
| 3,911,629 | A | * | 10/1975 | Steinmetz | 451/48 |
| 4,310,269 | A | | 1/1982 | Neu et al. | |
| 4,411,105 | A | * | 10/1983 | Raiha | 451/276 |
| 4,475,320 | A | * | 10/1984 | Webster | 451/5 |
| 4,489,523 | A | * | 12/1984 | Webster | 451/5 |
| 4,765,784 | A | | 8/1988 | Karwan | |
| 4,826,370 | A | | 5/1989 | Conradsson | |
| 4,837,432 | A | | 6/1989 | Katayama | |
| 4,837,983 | A | * | 6/1989 | Fuller, Jr. | 451/8 |
| 4,869,813 | A | * | 9/1989 | Bailey et al. | 209/538 |

(Continued)

*Primary Examiner*—Timothy V. Eley
(74) *Attorney, Agent, or Firm*—Stetina Brunda Garred & Brucker

(57) ABSTRACT

A completely automated apparatus for verifying the identity and geometry of drill bits, re-sharpening the cutting tip of a drill bit and re-positioning a locating ring upon the shank portion of the drill bit subsequent to the re-sharpening of the cutting tip thereof. The apparatus comprises a housing having a pair of cassette trays, a pair of grinding assemblies, a pair of optical assemblies, a pair of primary cleaning assemblies, a pair of secondary cleaning assemblies, a pair of inversion assemblies, a pair of workhead assemblies, a bumping assembly, and a loader assembly attached thereto. The workhead and loader assemblies are used to transport drill bits between the cassette trays and other assemblies in a selected sequence which is controlled and coordinated by a programmable control device. The control device is electrically interfaced to each of the assemblies and allows the cutting tip re-sharpening and locating ring re-positioning processes to be conducted simultaneously on at least two drill bits.

9 Claims, 12 Drawing Sheets

U.S. PATENT DOCUMENTS

| | | |
|---|---|---|
| 4,881,858 A | 11/1989 | Volk et al. |
| 5,004,930 A * | 4/1991 | Gremaud et al. ...... 250/559.14 |
| 5,123,789 A | 6/1992 | Ohtani et al. |
| 5,139,376 A | 8/1992 | Pumphrey |
| 5,308,198 A | 5/1994 | Pumphrey |
| 5,472,298 A | 12/1995 | Mihai |
| 5,649,853 A * | 7/1997 | Kuo ........................... 451/178 |
| 5,655,354 A | 8/1997 | Baker et al. |
| 5,804,789 A * | 9/1998 | Saito et al. .............. 219/69.17 |
| 5,830,045 A | 11/1998 | Togawa et al. |
| 6,191,856 B1 * | 2/2001 | Slemon et al. .............. 356/615 |
| 6,260,701 B1 | 7/2001 | Katayama et al. |
| 6,331,133 B1 | 12/2001 | Katayama et al. |

* cited by examiner

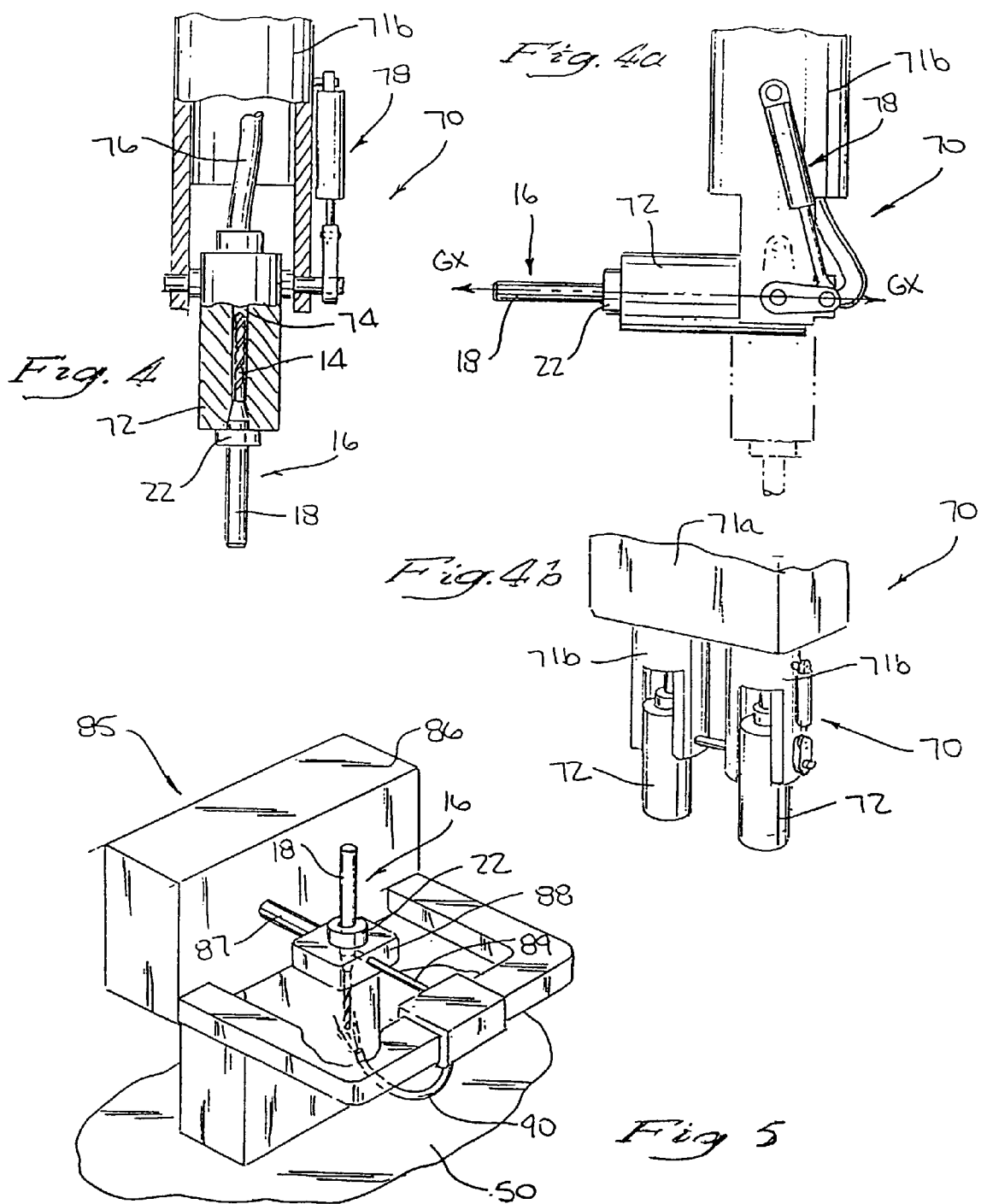

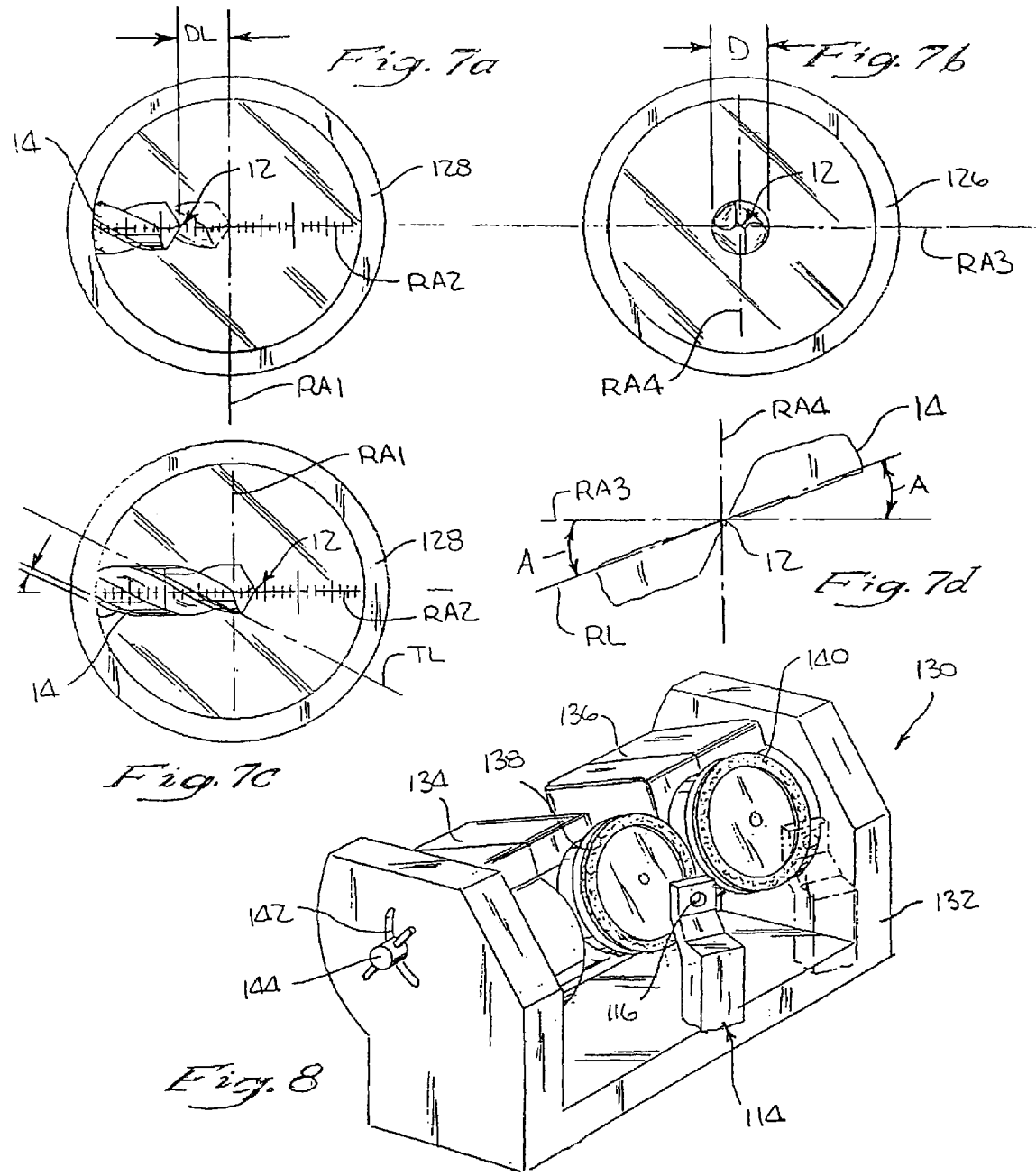

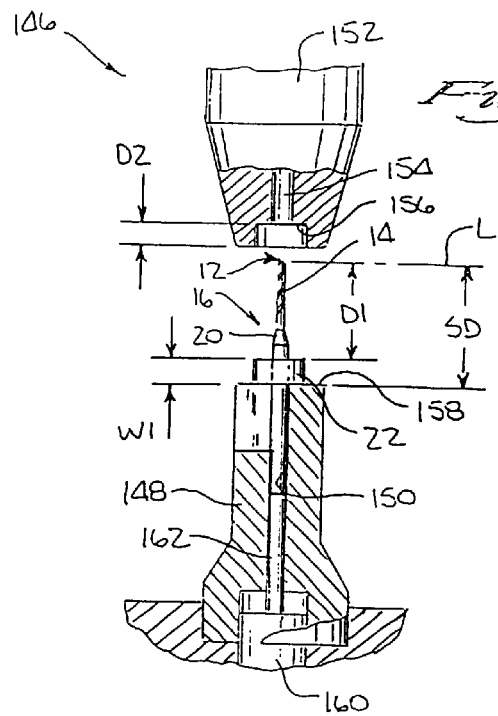
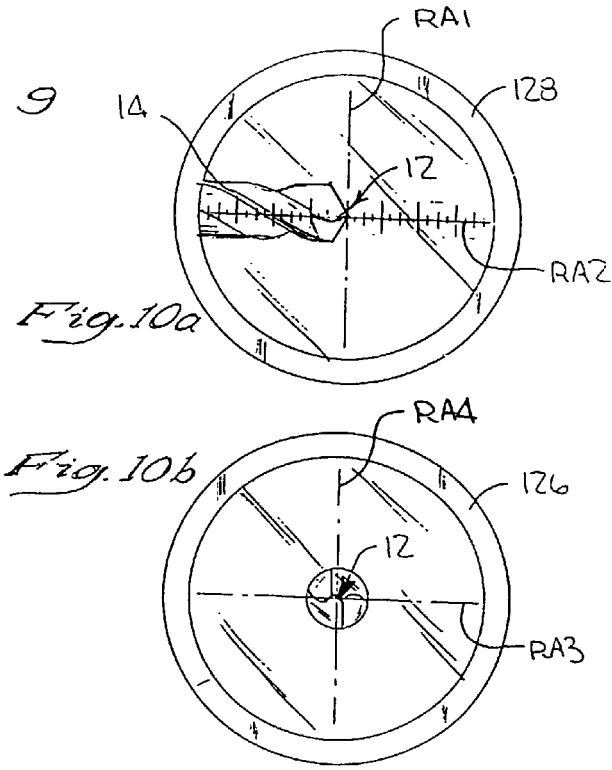
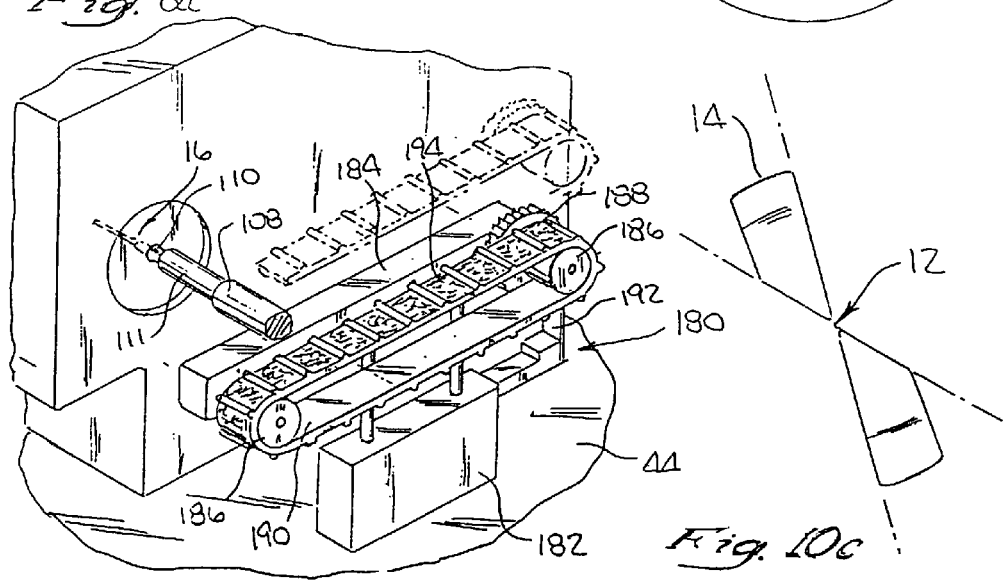

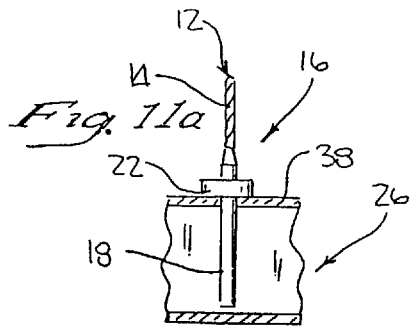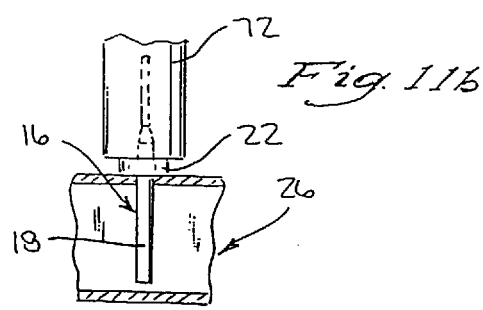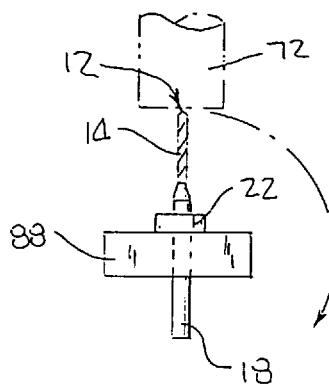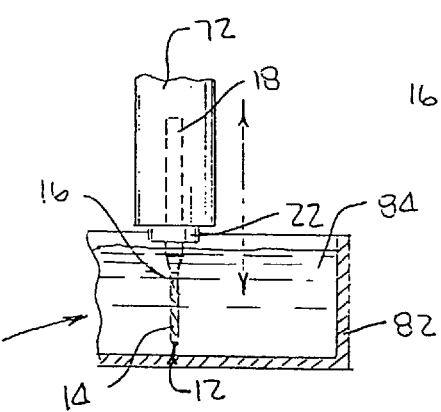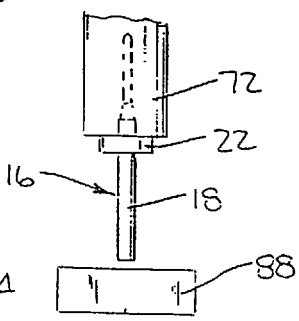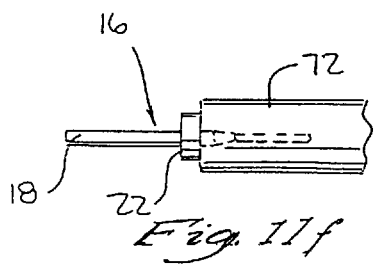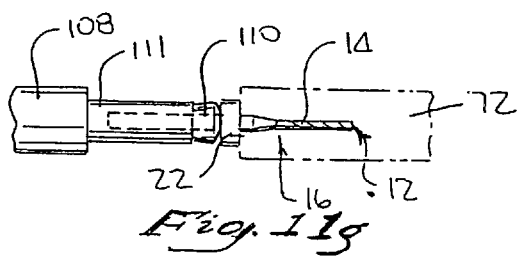

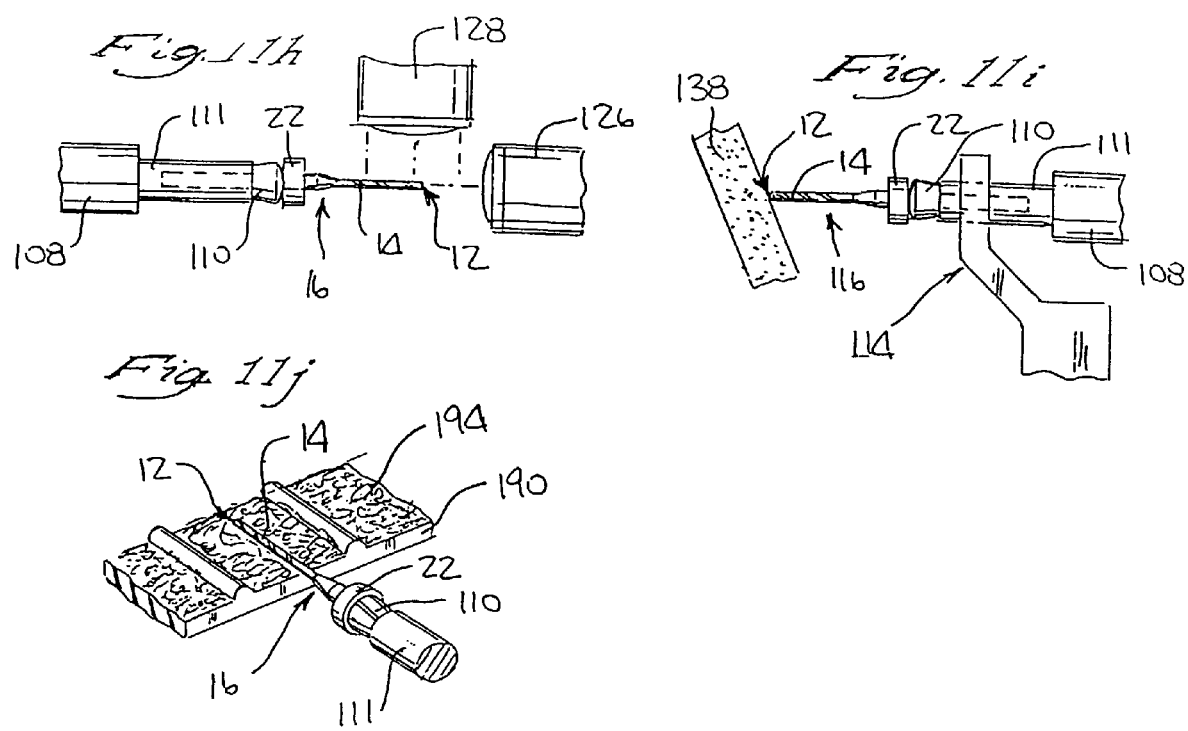

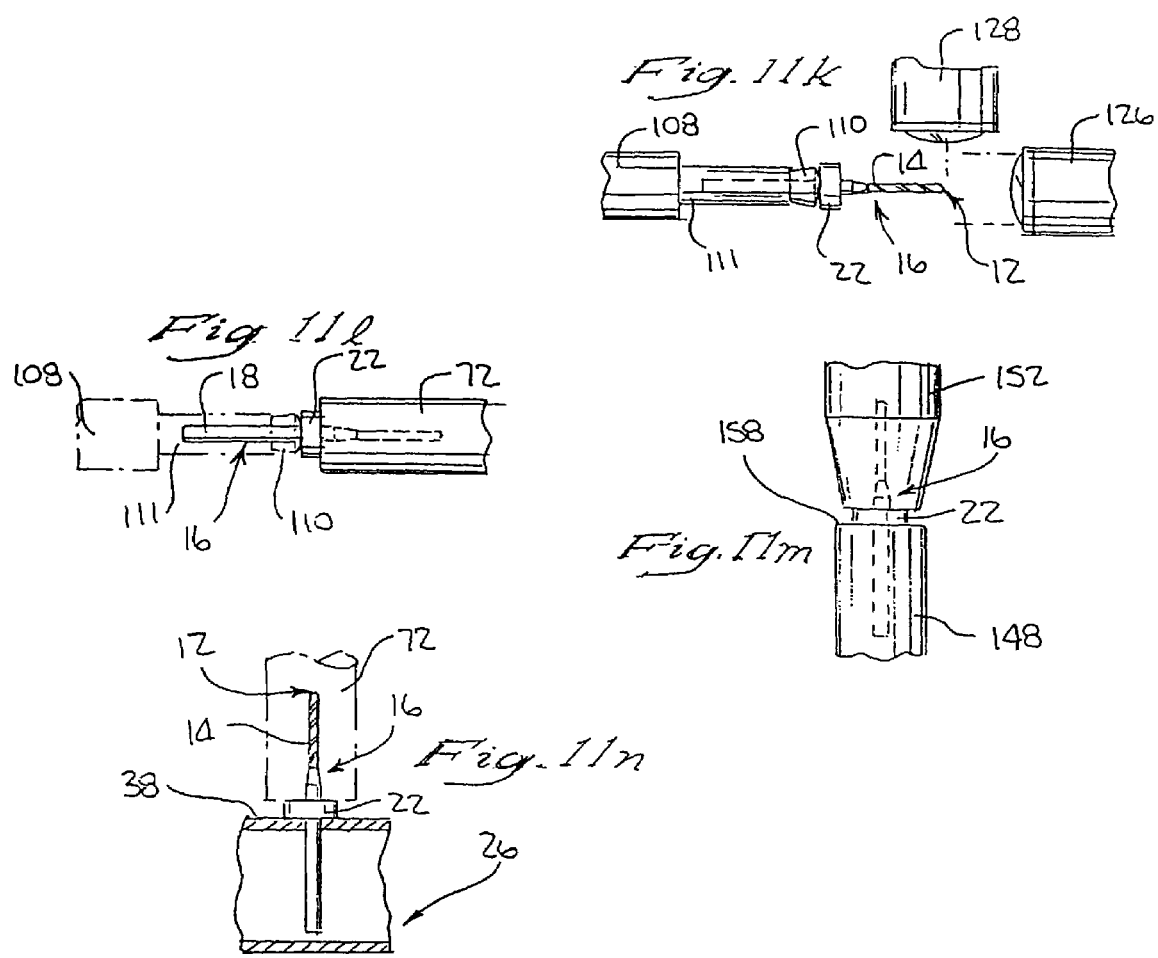

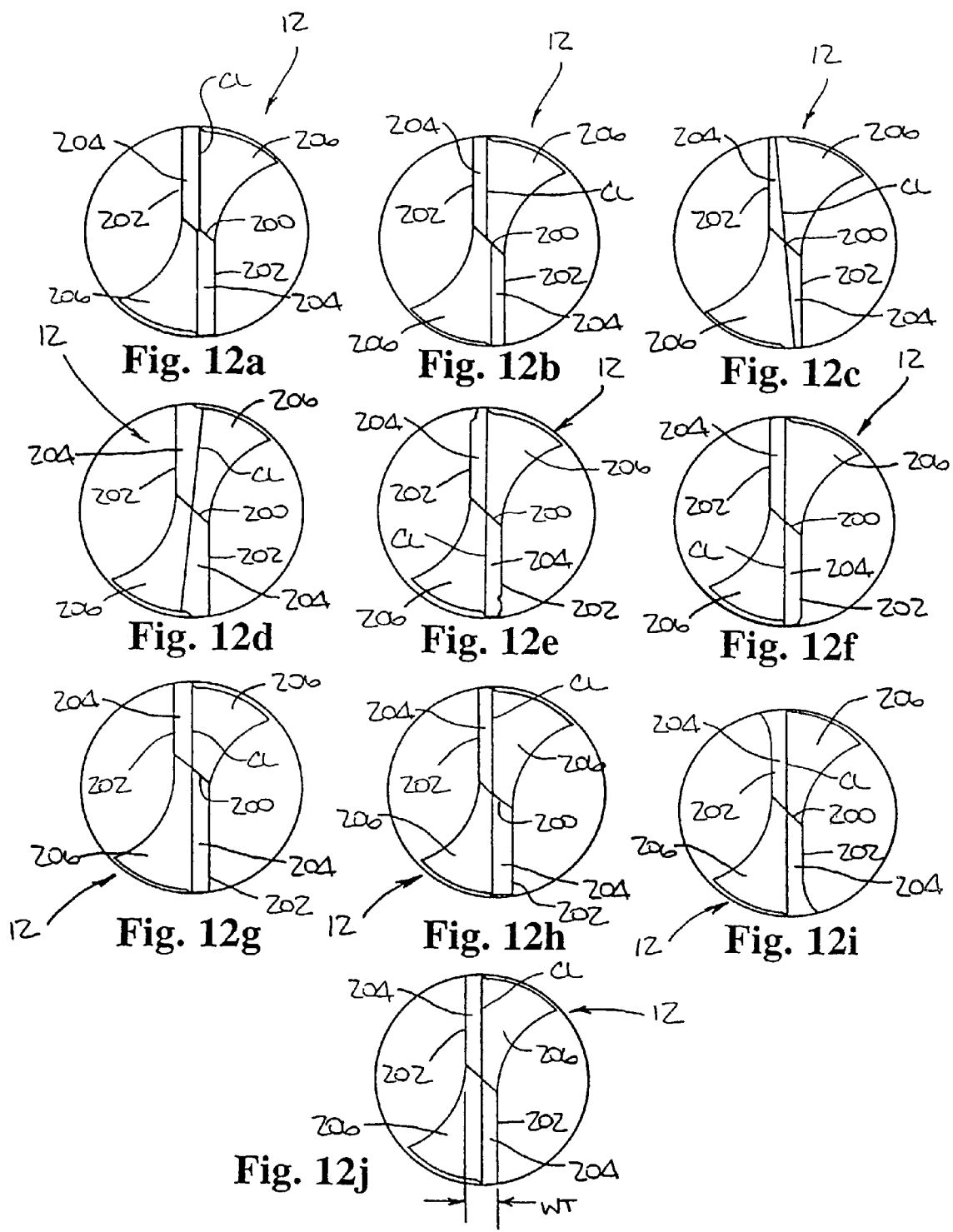

AUTOMATED DRILL BIT RE-SHARPENING AND VERIFICATION SYSTEM

RELATED APPLICATIONS

The present application is a divisional of U.S. Application Ser. No. 09/804,169 entitled AUTOMATED DRILL BIT RE-SHARPENING AND VERIFICATION SYSTEM filed Mar. 12, 2001 now U.S. Pat. No. 6,517,411, which is a continuation of U.S. Application Ser. No. 09/421,824 entitled AUTOMATED DRILL BIT RE-SHARPENING AND VERIFICATION SYSTEM filed Oct. 20, 1999 and now issued as U.S. Pat. No. 6,283,824 on Sep. 4, 2001, which is a continuation-in-part of U.S. Application Ser. No. 09/082,590 entitled AUTOMATED DRILL BIT RE-SHARPENING AND VERIFICATION SYSTEM filed May 21, 1998, and now issued as U.S. Pat. No. 6,030,276 on Feb. 29, 2000.

FIELD OF THE INVENTION

The present invention relates generally to devices :or re-sharpening machine tools, and more particularly to a completely automated system which verifies the identity and geometry of drill bits, re-sharpens the drill bits to within closely held tolerances, verifies re-sharpened drill bit tolerances, adjusts the positioning of a locating ring disposed upon the shank of the re-sharpened drill bits, cleans the re-sharpened drill bits and subsequently packages the same.

BACKGROUND OF THE INVENTION

The manufacture of printed circuit boards has experienced considerable improvement over recent years. Technological advancements in chemistry, machinery, and materials have resulted in the ability to consistently produce large volumes of printed circuit boards with dense circuitry patterns on a highly efficient basis. One particular area of progress has been in the drilling process associated with printed circuit boards. An individual circuit board typically includes thousands of small-diameter drilled holes which are used to connect various components to the board by accommodating the leads or pins thereof, to connect the circuitry traces of one layer to another, to provide reference points for subsequent processing, and to assist in mounting the complete circuit board within its final housing. In one currently known circuit board manufacturing process, a plurality of circuit boards are drilled simultaneously by maintaining the circuit boards in a contiguous, overlapped orientation. In another currently known fabrication technique, several circuit boards are placed on a panel for processing, with a single panel typically including tens of thousands of drilled holes.

As will be recognized, due to the extremely small diameter of the holes typically drilled in the printed circuit boards, the associated drill bits are formed having small diameter cutting tips and are made of an extremely hard, wear resistant material such as tungsten carbide. Though this material is resistant to wear, after a certain number of drilled holes ("hits"), the drill bit will typically deteriorate and will no longer be sharp enough to maintain the diameter and tolerance requirements for subsequent holes. Through experience, circuit board manufactures have approximated the rate at which drill bits dull. Based upon this wear rate, the drill bit is typically replaced after a certain number of hits.

During the printed circuit board manufacturing process, the depth to which the cutting tip of the drill bit penetrates, i.e., extends into, the circuit board(s) must also be tightly controlled. In this respect, the drill bits used to facilitate the drilling operation are typically provided with a locating ring disposed about the shank portion thereof which serves as a stop for accurately locating the drill bit, the collet, or the tool holder of the rotary drilling apparatus. Due to the importance of tightly controlling the penetration depth of the cutting tip of the drill bit into the circuit board(s), the distance separating the cutting tip from the locating ring must itself be tightly controlled, thus necessitating the precise positioning of the locating ring upon the shank portion of the drill bit.

In view of the difficulty and expense associated with the manufacture of carbide drill bits with small diameter cutting tips, once the cutting tip of the drill bit becomes dull, the same is typically re-sharpened rather than being discarded. As will be recognized, due to the importance of drilling all the holes within the circuit board(s) within closely held tolerances, the re-sharpening of the cutting tip of the drill bit must be accomplished in a precise, highly accurate manner. Additionally, since the re-sharpening procedure often results in a slight loss of length from the cutting tip region of the drill bit, the distance separating the cutting tip from the locating ring must be maintained within a certain, tightly controlled range. In this respect, the shortening of the drill bit which occurs as a result of the re-sharpening procedure requires that the position of the locating ring upon the shank portion be adjusted so as to once again achieve the desired separation distance between the locating ring and the sharpened cutting tip.

The re-positioning of the locating ring upon the shank portion of the drill bit is typically accomplished manually through the utilization of conventional measurement techniques and devices such as calipers. Additionally, the re-sharpening of the cutting tip of the drill bit and subsequent measurement thereof to ensure compliance with tolerance requirements are often accomplished manually. However, as will be recognized, such manual re-positioning and re-sharpening techniques are extremely time consuming and thus expensive, and oftentimes do not accomplish the positioning of the locating ring relative the cutting tip and/or the re-sharpening of the cutting tip with the degree of accuracy needed to ensure that the subsequent drilling operation will be properly conducted.

There has yet to be developed in the prior art an completely automated system for accomplishing the verification of identity and differing geometries of various drill bits and the re-sharpening and re-positioning functions described above. One of the difficulties in automating the re-sharpening process is that the size and condition of the cutting tip of the drill bit often varies. In this respect, the cutting tip may be dirty, worn, undersize in diameter and/or length, chipped, or broken. Additionally, drill bits are typically sent for re-sharpening in large quantities, with such quantities including drill bits that are from different manufacturers, have different dates of original manufacture, are of differing styles and/or series, or are being subjected to a first or subsequent re-sharpening procedure.

The present invention specifically addresses the above-described deficiencies and obstacles by providing a completely automated system which automatically verifies the identity and geometry of drill bits, re-sharpens the cutting tip of a drill bit to within closely held tolerances, and accurately adjusts the positioning of the locating ring upon the drill bit subsequent to the re-sharpening of the cutting tip thereof.

SUMMARY OF THE INVENTION

In accordance with the present invention, there is provided an automated apparatus for verifying the identity and geometry of drill bits and re-sharpening the drill bit having a shank portion including a locating ring positioned thereupon, and a fluted portion which defines a cutting tip of the drill bit. In addition to functioning to re-sharpen the cutting tip of the drill bit, the present automated apparatus functions to adjust the position of the locating ring relative to the cutting tip subsequent to the re-sharpening thereof.

In the preferred embodiment, the automated apparatus comprises a housing or base table having at least one and preferably a pair of cassette trays attached thereto, each of which is sized and configured to accommodate multiple drill bit containers. Each of the drill bit containers includes a plurality of drill bits stored therewithin. Also attached to the housing is a pair of grinding assemblies, each of which is used to grind the cutting tip of a drill bit, and a pair of vision or optical assemblies, each of which is used to conduct an initial verification of the identity and geometry of the drill bit inspection of the cutting tip of a drill bit prior to the grinding thereof and a final inspection of the cutting tip subsequent to the grinding thereof. In addition to the grinding and optical assemblies, attached to the housing is a pair of primary cleaning assemblies which are each used for cleaning the cutting tip of a drill bit prior to the initial inspection thereof, and a pair of secondary cleaning assemblies which are each used for cleaning the cutting tip of a drill bit prior to the final inspection thereof. Also attached to the housing is a pair of inversion assemblies for selectively directing one of the shank portion and the fluted portion of a drill bit generally vertically upwardly, and at least one bumping assembly which is used for adjusting the position of the locating ring of a drill bit relative to its cutting tip subsequent to the final inspection thereof.

The automated apparatus of the present invention further comprises a pair of workhead assemblies which are each movably attached to the housing and used for selectively transporting a drill bit between respective ones of the optical, grinding, and secondary-cleaning assemblies. Also movably or rotatably attached to the housing is a robotic loader assembly of the automated apparatus which is used to selectively transport drill bits from the cassette trays to respective ones of the inversion assemblies if required by the orientation of the drill bits within the drill bit containers, from the cassette trays or inversion assemblies to respective ones of the primary cleaning assemblies, from the primary cleaning assemblies to respective ones of the inversion assemblies, from the inversion assemblies to respective ones of the workhead assemblies, from the workhead assemblies to the bumping assembly, and from the bumping assembly back to respective ones of the cassette trays.

In the present automated apparatus, a programmable control device is electrically interfaced to the grinding, optical, secondary cleaning, inversion, bumping, workhead, and loader assemblies to control and coordinate the operations thereof in a manner allowing the cutting head re-sharpening and locating ring re-positioning processes to be conducted simultaneously on at least two drill bits. In this respect, the control device is operable to cause the loader assembly to remove the drill bits from each drill bit container one at a time, and return each of the drill bits to the drill bit container from which it was removed subsequent to the final inspection of the cutting tip or the re-positioning of the locating ring.

In the preferred embodiment, the loader assembly of the automated apparatus comprises a robotic arm which is rotatable about first, second and third generally parallel loader axes, and movable linearly (i.e., upwardly and downwardly) along the third loader axis. Attached to the robotic arm is a gripper which is adapted to receive and releasably hold one or two drill bits, and is pivotally movable relative to the third loader axis. The gripper itself comprises a pair of shaft members which are pivotally connected to the robotic arm. Each of the shaft members has an aperture extending therethrough which is sized and configured to receive the shank portion of a drill bit. The gripper further comprises a rotary actuator member which is connected to the robotic arm and mechanically coupled to the shaft members in a manner wherein the movement of the actuator results in the concurrent pivotal movement of the shaft members relative to the robotic arm. In addition to the shaft and actuator members, the gripper comprises an elongate vacuum tube which is fluidly connected to the apertures for selectively creating negative pressure therewithin. The creation of a vacuum within each of the apertures subsequent to the receipt of the shank portion of a drill bit thereinto facilitates the retention of the drill bit within the gripper of the loader assembly.

Each of the optical assemblies of the automated apparatus comprises top and front cameras for generating images which are used to determine the overall length of the drill bit, the diameter and geometry of the cutting tip thereof, and the condition of the margins thereof. The images generated by the top and front cameras are further used to index the cutting tip to selected reference points. In addition to the top and front cameras, each optical assembly further includes an illumination array for illuminating the fluted portion and the cutting tip, and control logic which is operative to process and interpret the images generated by the top and front cameras. The control logic of each of the optical assemblies also interacts with the control device in a manner facilitating the regulation of the movement of each of the workhead assemblies in a prescribed manner based on the generated images.

Each of the grinding assemblies comprises at least one grinder motor having a grinder head rotatably connected thereto. The grinder head itself defines a grinding face. Each grinding assembly further comprises an adjustment mechanism which is attached to the grinder motor and is operative to selectively move the grinder head into and out of contact with the cutting tip of the drill bit based upon the level of contact pressure exerted by the cutting tip against the grinding face. The adjustment mechanism itself comprises a housing having an elongate ball screw rotatably mounted thereto. Mechanically coupled to the ball screw is a stepper motor which is operative to selectively rotate the ball screw in either a first direction or a second direction opposite the first direction. Additionally, cooperatively engaged to the ball screw is a linear bearing. In the adjustment mechanism, the rotation of the ball screw in the first direction facilitates the movement of the linear bearing toward a respective workhead assembly. Conversely, the rotation of the ball screw in the second direction facilitates the movement of the linear bearing away from the corresponding workhead assembly. The grinder motor is itself attached to the linear bearing.

Each of the primary cleaning assemblies of the automated apparatus comprises a bath having a quantity of cleaning putty disposed therein. The cutting tip of a drill bit is insertable into and removable from within the cleaning putty of each primary cleaning assembly via the loader assembly.

Additionally, each of the secondary cleaning assemblies comprises a base member having a conveyor member movably attached thereto. The conveyor member is selectively movable between extended and retracted positions relative to the base member, and includes a quantity of cleaning putty disposed thereon. In addition to the base and conveyor members, each secondary cleaning assembly comprises an indexing member which is attached to the base member and operable to index the conveyor member a prescribed incremental distance when the conveyor member is moved from its extended position to its retracted position. The cutting tip of a drill bit is insertable into the cleaning putty of a respective one of the secondary cleaning assemblies by a respective one of the workhead assemblies, with such insertion occurring immediately prior to the final inspection of the cutting tip by a respective one of the optical assemblies.

Each of the workhead assemblies of the automated apparatus comprises a base member which is reciprocally moveable relative to the housing along a first axis. Rotatably connected to the base member is a swivel member which is rotatable about a second axis extending in generally perpendicular relation to the first axis. Movably attached to the swivel member is a collet member which is adapted to receive and releasably hold the shank portion of a drill bit. The collet member is reciprocally movable along and rotatable about a third axis which extends in generally perpendicular relation to the second axis. The insertion of a drill bit into the collet and the removal of the drill bit from therewithin is accomplished via the loader assembly. Each workhead assembly further comprises a support member which is attached to the base member and receives and supports a portion of the collet member when the cutting tip is being ground by a respective one of the grinding assemblies.

The bumping assembly of the automated apparatus comprises a drill seat which is attached to the housing for slidably receiving the shank portion of a drill bit. In addition to the drill seat, the bumping assembly comprises an adjustment mechanism which is attached to the housing and used for positioning the cutting tip a desired separation distance from the drill seat, and a reciprocal ram assembly which is movably attached to the housing and used for selectively bumping the locating ring into abutting contact with the drill seat subsequent to the shank portion being inserted into the drill seat and the cutting tip being positioned at the separation distance from the drill seat. The drill bit is insertable into and removable from within the drill seat via the loader assembly.

Each of the inversion assemblies of the automated apparatus comprises a base member and a rotatable inversion arm which is attached to the base member and adapted to receive a drill bit. In addition to the base member and inversion arm, each of the inversion assemblies comprises a locking pin which is attached to the base member for maintaining the drill bit within the inversion arm. Also attached to the base member is an air stream generator of the inversion assembly which is used to remove residual putty from the cutting tip of the drill bit within the inversion arm. Drill bits are inserted into and removed from within the inversion arm of each of the inversion assemblies via the loader assembly.

Further in accordance with the present invention, there is provided an automated method of re-sharpening a drill bit having a shank portion which includes a locating ring positioned thereupon and a fluted portion which defines a pair of margins and a cutting tip. The present method employs the use of an automated re-sharpening apparatus which includes a pair of cassette trays, a pair of grinding assemblies, a pair of optical assemblies, a pair of primary cleaning assemblies, a pair of secondary cleaning assemblies, a pair of workhead assemblies, a bumping assembly, and a loader assembly. In addition to re-sharpening the cutting tip of the drill bit, the present method also achieves the re-positioning of the locating ring relative to the cutting tip if necessitated by the re-sharpening thereof.

The present method comprises the initial step of positioning at least one, and preferably multiple drill bit containers onto respective ones of the cassette trays, with each of the drill bit containers including a plurality of drill bits stored therewithin. Thereafter, the drill bits are removed from each drill bit container one at a time via the loader assembly. Such removal is accomplished by advancing the loader assembly over the drill bit and into contact with the locating ring positioned upon the shank portion thereof. Thereafter, negative pressure is created within the loader assembly at a level sufficient to retain the drill bit therewithin.

The drill bits may be oriented within each of the drill bit containers such that either the shank portion or fluted portion thereof is directed generally vertically upwardly. If, during the removal of a drill bit from within a respective drill bit container, the loader assembly is advanced over the fluted portion, the drill bit is thereafter inserted into the rotatable arm of a respective one of the inversion assemblies via the loader assembly such that the fluted portion is directed generally vertically upwardly. Thereafter, the pressure within the loader assembly is equalized, with the loader assembly then being retracted away from the drill bit. The inversion arm is then rotated such that the shank portion is directed generally vertically upwardly. Subsequent to this "flipping" of the drill bit, the loader assembly is advanced over the shank portion thereof and into contact with the locating ring positioned thereupon. Negative pressure is then again created within the loader assembly at a level sufficient to retain the drill bit therewithin. The drill bit is then removed from within the inversion arm via the loader assembly.

After the drill bit has been inverted and re-grasped by the loader assembly in the above-described manner, the fluted portion of the drill bit protrudes from the loader assembly. The cutting tip of the drill bit is then inserted into and removed from within the quantity of cleaning putty of one of the primary cleaning assemblies via the loader assembly. If, during the removal of the drill bit from within a respective one of the drill bit containers, the loader assembly is advanced over the shank portion of the drill bit rather than the fluted portion thereof, the drill bit need not be inverted prior to the cleaning of the cutting tip thereof via a respective one of the primary cleaning assemblies since the fluted portion already protrudes from the loader assembly. Rather, subsequent to the removal of the drill bit from within a respective one of the drill bit containers, the cutting tip thereof is inserted into and removed from within the quantity of cleaning putty of one of the primary cleaning assemblies via the loader assembly.

After being cleaned by one of the primary cleaning assemblies, the drill bit is inserted into the rotatable arm of a respective one of the inversion assemblies via the loader assembly such that the shank portion thereof is directed generally vertically upwardly. The pressure within the loader assembly is then equalized, with the loader assembly then being retracted from the drill bit. The air stream generator is then used to blow air onto the cutting tip of the drill bit to remove any residual cleaning putty therefrom. Thereafter, the inversion arm is rotated such that the fluted portion of the drill bit is directed generally vertically upwardly. The loader assembly is then advanced over the fluted portion of the drill bit and into contact with the locating ring positioned upon the shank portion thereof. Negative pressure is then again created within the loader assembly at a level sufficient to retain the drill bit therewithin, with the drill bit then being removed from within the inversion arm via the loader assembly.

After being removed from within the inversion assembly, the drill bit is transferred from the loader assembly to a respective one of the workhead assemblies. More particularly, the shank portion of the drill bit is inserted into a respective one of the workhead assemblies via the loader assembly. Once releasably held within a respective workhead assembly, the fluted portion of each drill bit is inserted into the interior of a respective one of the optical assemblies thereby.

Once inserted into a respective optical assembly, the overall length of the drill bit is determined, as is the diameter of the cutting tip and the condition of the margins. Thereafter, the cutting tip is indexed to a prescribed position. The determination of the overall length of the drill bit is preferably accomplished by indexing the cutting tip to a first reference point on a second reference axis generated by the control logic of the optical assembly via the workhead assembly. This step is followed by determining the distance between the first reference point and a point of intersection between the first reference axis and a second reference axis also generated by the control logic of the optical assembly. The control logic of the optical assembly is further operative to generate a reference line and a target line, with the step of indexing the cutting tip to a prescribed position preferably being initiated by the generation of the reference line along the cutting tip of the drill bit. Thereafter, the drill bit is rotated via the workhead assembly to adjust the angular orientation of the reference line relative to a third reference axis generated by the control logic of the optical assembly to within a prescribed range. The cutting tip is then indexed to a second reference point on the second reference axis, with the target line thereafter being generated along one of the margins of the fluted portion. Finally, the drill bit is rotated via the workhead assembly as needed to cause the target line to cross the point of intersection between the first and second reference axes. The drill bit is thereafter removed from within the optical assembly via the workhead assembly.

After the initial evaluation of the fluted portion and the cutting tip of each drill bit has been completed by a respective optical assembly, the cutting tip of each drill bit is ground via a respective one of the grinding assemblies. In particular, the cutting tip of each drill bit is moved into contact with a respective grinding assembly via the workhead assembly in which the drill bit is releasably held. After its initial movement into the grinding assembly, the cutting tip of the drill bit is backed away therefrom via the workhead assembly, and then rotated approximately 180° thereby. Subsequent to such rotation, the cutting tip is then moved back into contact with and thereafter drawn back away from the grinding assembly. Importantly, the grinding operation conducted on the cutting tip of each drill bit by a respective one of the grinding assemblies is governed by the initial evaluation of the fluted portion and cutting tip of the drill bit by the corresponding optical assembly. Additionally, when the cutting tip of each drill bit is moved into contact with a respective one of the grinding assemblies, a portion of the collet member of the associated workhead assembly is advanced through and supported by the support member of the workhead assembly to reduce the vibration of the cutting tip during the grinding process. During each of the grinding operations described above, the grinding assembly may be retracted away from the cutting tip of the drill bit in the event the contact pressure between the cutting tip and the grinding assembly exceeds a prescribed level.

Subsequent to being ground, the drill bits are carried by the workhead assemblies in which they are releasably held to respective ones of the secondary cleaning assemblies. As the workhead assembly approaches a respective secondary cleaning assembly, the conveyor member of the secondary cleaning assembly is actuated to its extended position, thus placing a portion of the cleaning putty disposed thereon into horizontal alignment with the cutting tip of the drill bit. The cutting tip of the drill bit is then inserted into the cleaning putty of the secondary cleaning assembly by the associated workhead assembly. The conveyor member of the secondary cleaning assembly is then actuated back to its retracted position. Importantly, the movement of the conveyor member back to its retracted position causes the indexing member attached to the base member of the secondary cleaning assembly to index the conveyor member a prescribed incremental distance. Such movement of the conveyor member causes the cutting tips of subsequently cleaned drill bits to be inserted into different portions of the cleaning putty disposed upon the conveyor member.

After being cleaned by respective ones of the secondary cleaning assemblies, the drill bits are re-inserted by the workhead assemblies into respective ones of the optical assemblies. Within each optical assembly, a final evaluation of the drill bit is conducted. In the final evaluation, the overall length of the drill bit is determined, as is the geometry of the cutting tip and condition of the margins thereof. The determination of the overall length of the drill bit is accomplished in the same manner previously described in relation to the initial evaluation. Subsequent to the completion of such measurements, the drill bit is then removed from within the optical assembly via the workhead assembly in which it is releasably held. The final evaluation of each drill bit also includes a determination as to whether the locating ring of the drill bit is properly positioned relative to the cutting tip thereof.

If it is determined that the positioning of the locating ring relative to the cutting tip must be adjusted, the drill bit is transported from its associated workhead assembly to the bumper assembly via the loader assembly. In particular, the shank portion of the drill bit is inserted into a drill seat of the bumping assembly, with the cutting tip then being positioned at a desired separation distance from the drill seat. Thereafter, the locating ring is bumped into abutting contact with the drill seat. Subsequent to the completion of this bumping operation, the drill bit is transported from the bumping assembly back to a respective one of the cassette trays via the loader assembly. More particularly, the drill bit is returned by the loader assembly to the precise location in the drill bit container from which it was initially removed. As will be recognized, if during the final evaluation of the drill bit it is determined that the position of the locating ring need not be adjusted, the drill bit is transported directly from the workhead assembly to the proper cassette tray by the loader assembly. Additionally, if during the final evaluation of the drill bit it is determined that there is a fault in the geometry of its cutting tip, the drill bit is not transported to the bumping assembly or to a drill bit container on one of the cassette trays, but rather is rejected to a separate location by the loader assembly.

In the present method, the drill bits need not necessarily be removed from and returned to the cassette trays, and in particular the drill bit containers positioned thereon, but rather may be removed from any pick-up location and returned to any drop-off location. Additionally, in the present method, data corresponding to the initial and final evaluations of each of the drill bits processed by the re-sharpening apparatus is preferably stored within the control device. This data may be used to facilitate the generation of a statistical process control report regarding the processed drill bits. This data may also be used to generate a used drill profile which may itself be used to adjust the manner in which the cutting tips of subsequently processed drill bits are ground by the re-sharpening apparatus. Moreover, the data generated and stored in relation to the drill bits may be used to facilitate the sorting thereof in a manner wherein the drill bits are transported to respective ones of multiple drop-off locations according to the final evaluations related thereto.

In the above-described steps of the present method wherein the loader assembly is used to transport the drill bit between the workhead assemblies and the bumping assembly and between the bumping assembly and respective ones of the cassette trays, such transport is accomplished in the same manner previously described in relation to the removal of the drill bit from one of the cassette trays via the loader assembly, the insertion of the drill bit into and the removal of the drill bit from within a respective one of the inversion assemblies by the loader assembly both prior and subsequent to the initial cleaning of the cutting tip thereof, and the transfer of the drill bit from the loader assembly to a respective one of the workhead assemblies. More particularly, the loader assembly is initially advanced over the fluted portion of the drill bit and into contact with the locating ring positioned upon the shank portion. Thereafter, negative pressure is created within the loader assembly at a level sufficient to retain the drill bit therewithin. After the shank portion of the drill bit has been inserted into either a workhead assembly, the drill seat of the bumping assembly, or the drill bit container, the pressure within the loader assembly is equalized, with the loader assembly then being retracted from the drill bit.

For each drill bit to be inserted into and removed from within the inversion arm of an inversion assembly, the drill seat of the bumping assembly, and the drill bit container, the drill bit must be maintained in a generally vertical orientation by the loader assembly. However, to be inserted into and removed from within each workhead assembly, the drill bit must be maintained in a generally horizontal orientation by the loader assembly. As such, the loader assembly is adapted to pivot to accomplish the extension of the drill bit either vertically or horizontally as needed.

BRIEF DESCRIPTION OF THE DRAWINGS

These, as well as other features of the present invention, will become more apparent upon reference to the drawings wherein:

FIG. 4 is a partial cross-sectional view of one of the shaft members of the gripper of the loader assembly of the present re-sharpening apparatus;

FIG. 4a is a side elevational view of the gripper of the loader assembly, illustrating the manner in which it is pivotally movable relative to the robotic arm of the loader assembly;

FIG. 4b is a perspective view of the gripper of the loader assembly;

FIG. 5 is a perspective view of one of the inversion assemblies of the present re-sharpening apparatus, illustrating the manner in which a drill bit is maintained therein;

FIGS. 7a–7d are step-by-step illustrations of the initial evaluation procedure conducted on a drill bit by each optical assembly of the present re-sharpening apparatus;

FIG. 8 is a front perspective view of one of the grinding assemblies of the present re-sharpening apparatus;

FIG. 8a is a perspective view of one of the secondary cleaning assemblies of the present re-sharpening apparatus;

FIG. 9 is a partial cross-sectional view of the bumping assembly of the present re-sharpening apparatus;

FIGS. 10a–10c are step-by-step illustrations of the final inspection procedure conducted on a drill bit by each optical assembly of the present re-sharpening apparatus;

FIGS. 11a–11n are step-by-step illustrations of the preferred sequence of operations conducted by the present re-sharpening apparatus;

FIGS. 12a–12j are end views of the cutting tip of a drill bit, illustrating various possible conditions thereof subsequent to the completion of operations conducted by the present re-sharpening apparatus.

DETAILED DESCRIPTION OF THE PREFERRED EMBODIMENT

Figure 1:
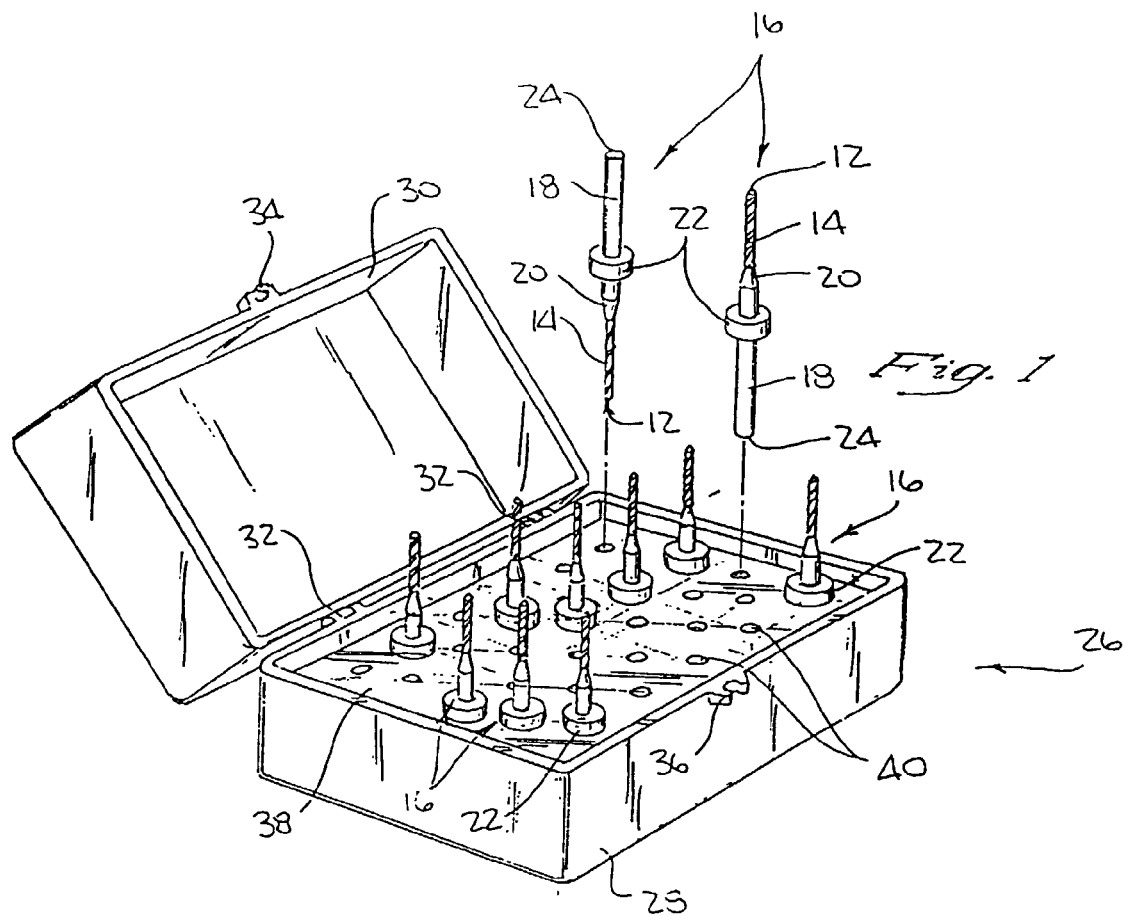
FIG. 1 is a perspective view of a drill bit container used with the re-sharpening apparatus of the present invention, illustrating the manner in which multiple drill bits are stored therewithin.
Figure 2A:
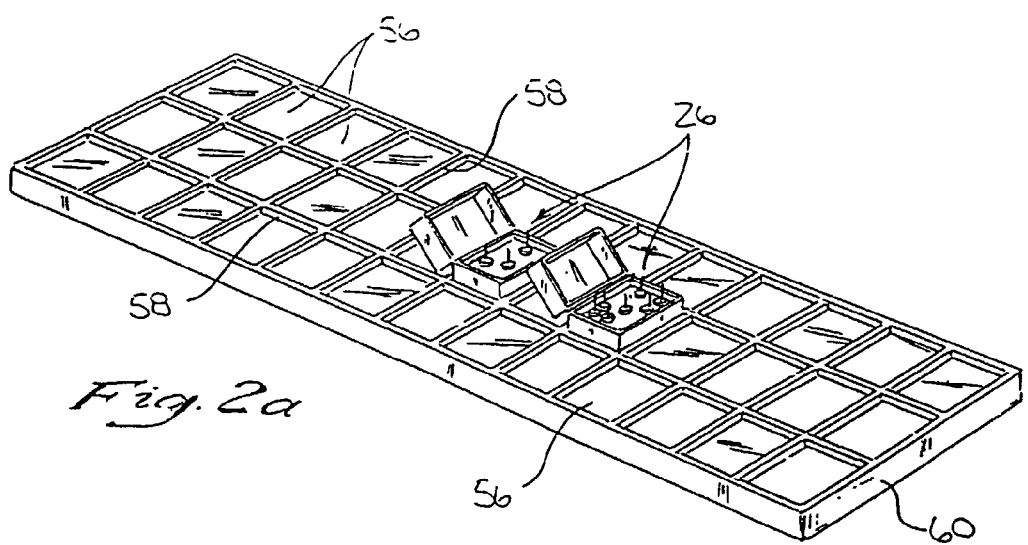
FIG. 2a is a perspective view of one of the cassette trays of the present re-sharpening apparatus, illustrating the manner in which multiple drill bit containers are positioned thereupon.
Figure 2:
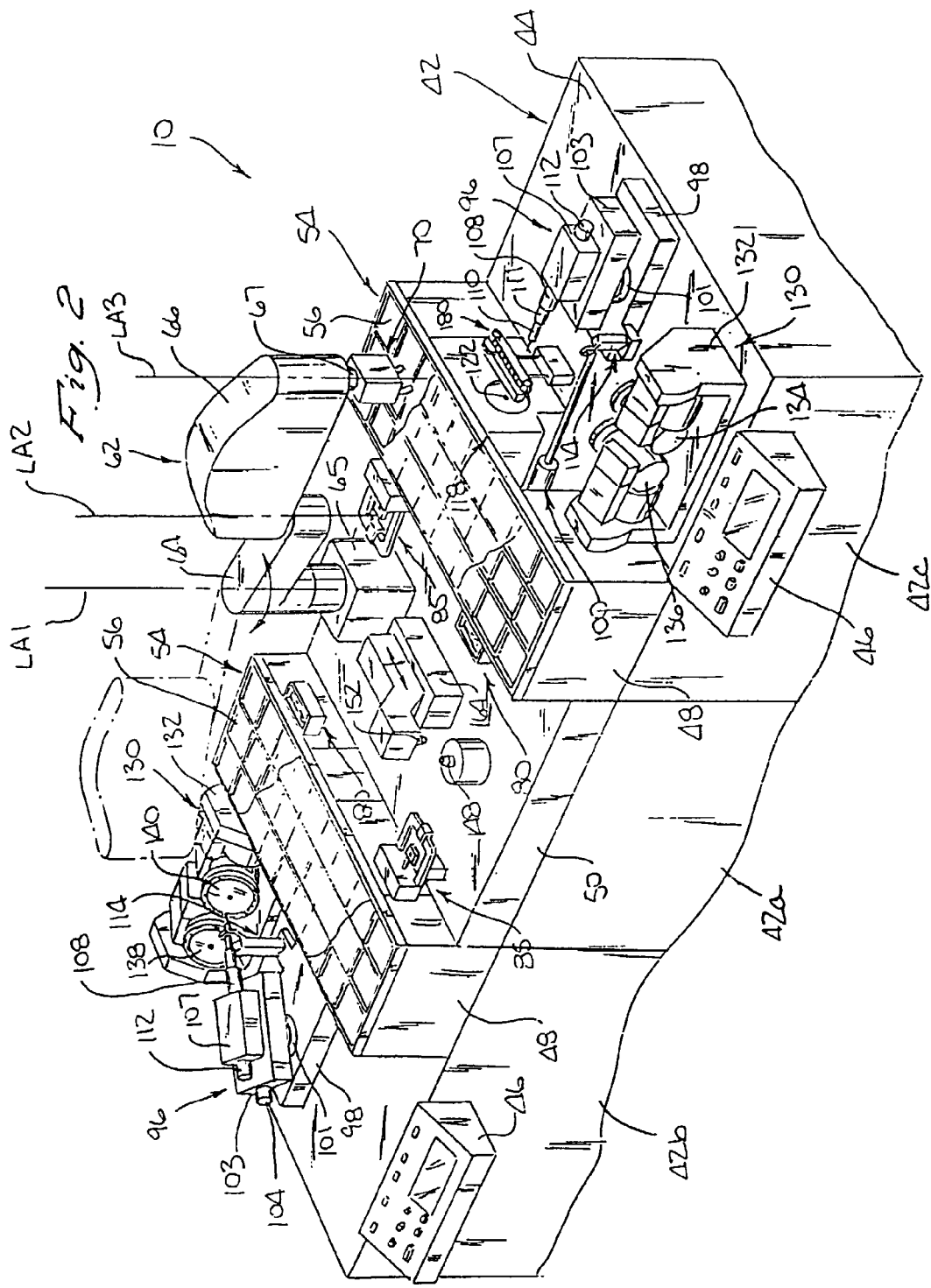
FIG. 2 is a front perspective view of the re-sharpening apparatus of the present invention.
Figure 3:
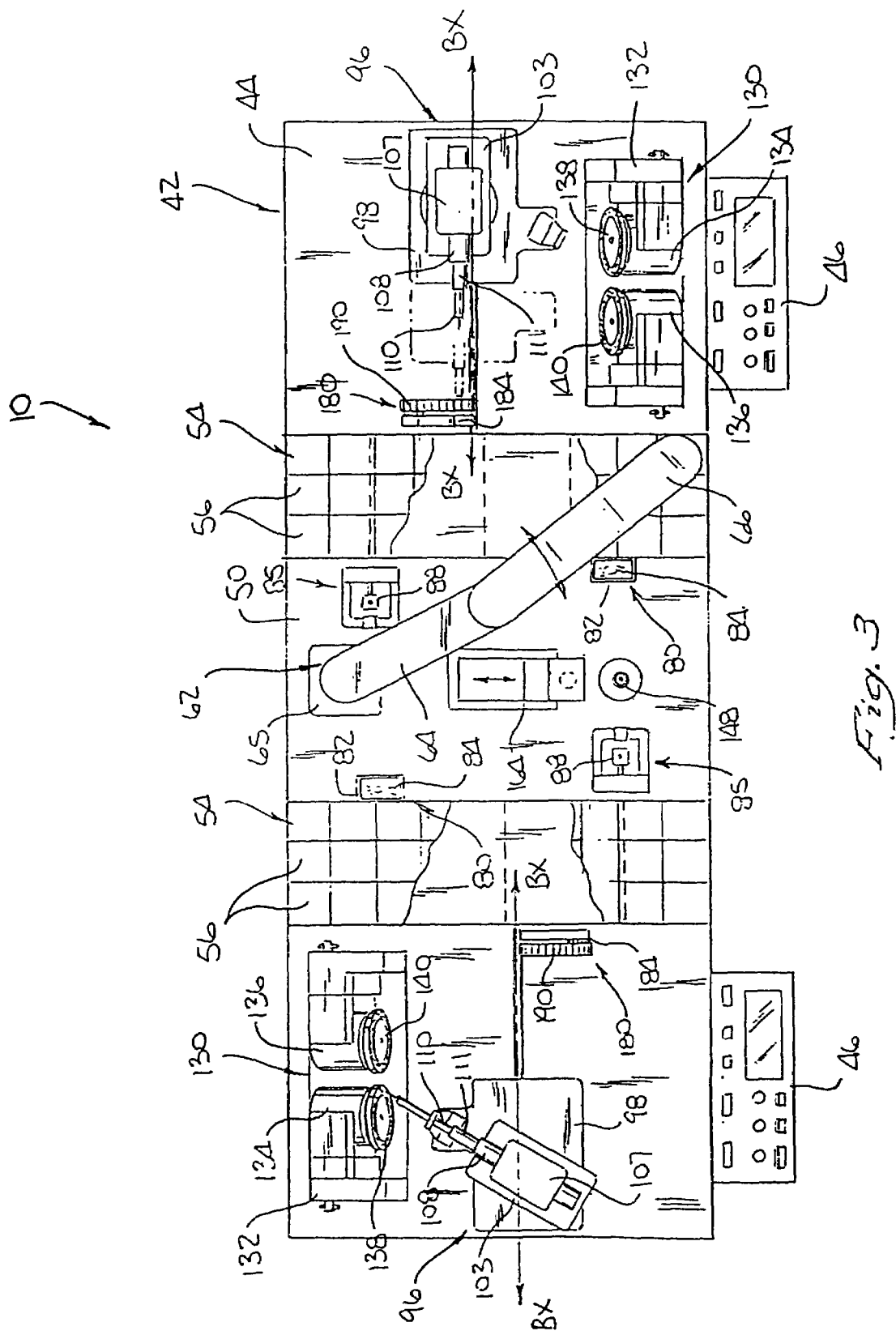
FIG. 3 is a top view of the re-sharpening apparatus of the present invention.

Referring now to the drawings wherein the showings are for purposes of illustrating a preferred embodiment of the present invention only, and not for purposes of limiting the same, FIGS. 2 and 3 illustrate the completely automated drill bit verification and re-sharpening apparatus 10 constructed in accordance with the present invention. As will be described in more detail below, the apparatus 10 is utilized to automatically verify the identity and geometry of a drill bit 16 and re-sharpen the cutting tip 12 included on the distal end of the fluted portion 14 of a drill bit 16 (shown in FIG. 1). The drill bit 16 further includes a cylindrically configured shank portion 18 which transitions into the fluted portion 14 via a tapered region 20. Positioned upon the shank portion 18 is an annular locating or setting ring 22. The locating ring 22, which is placed along the shank portion 18 at a standardized position for subsequent use, is normally located about 0.8 inches from the end 24 of the shank portion 18, and is frictionally maintained at this position upon the shank portion 18.

FIG. 12j illustrates a cutting tip 12 having an optimum point geometry. As seen in FIG. 12j, the cutting tip 12 of the drill bit 16 includes a chisel edge 200 which defines the distal-most point of the cutting tip 12. In addition to the chisel edge 200, the cutting tip 12 includes an opposed pair of cutting edges 202. The lateral distance between the cutting edges 202 defines the web thickness WT of the cutting tip 12. In FIG. 12j, a center line CL is shown as bisecting the cutting tip 12 into two (2) identical halves. Those portions of the cutting tip 12 between the center line CL and the straight sections of the cutting edges 202 define the primary faces 204 of the cutting tip 12. Those portions of the cutting tip 12 between the center line CL and the arcuate sections of the cutting edges 202 define the secondary faces 206 of the cutting tip 12. As seen in FIG. 7c, the fluted portion 14 of the drill bit 16 includes a pair of margins, each of which are of a margin width MW. The margins extend distally to the cutting tip 12 of the drill bit 16.

As previously explained, the drill bit 16 is typically fabricated from carbide or tungsten carbide, and utilized in relation to the manufacture of printed circuit boards. The drill bit 14, and in particular the fluted portion 14 thereof, is used to form a plurality of small diameter holes within a single circuit board or a plurality of overlapped circuit boards for accommodating the pins or leads of the electrical components which are to be subsequently interfaced to the circuit board(s). In addition to the diameters of the holes within the circuit board(s) needing to be held within close tolerances, the depth to which the cutting tip 12 of the drill bit 16 penetrates (i.e., is extended into) the circuit board(s) must also be accurately controlled to insure proper drilling tolerances. Such depth control is typically accomplished through the axial positioning of the frictionally mounted locating ring 22 upon the shank portion 18. In this respect, the extension of the shank portion 18 into the collet or tool holder of a drilling apparatus (not shown) is limited by the abutment of the locating ring 22 thereagainst. Since the locating ring 22 serves as a "stop" for controlling the length of the drill bit 16 which extends from the tool holder, the distance D1 separating the cutting tip 12 from the locating ring 22 must be maintained within a certain, close tolerance range to insure proper circuit board drilling.

Due to the expense associated with the manufacture of the drill bit 16, after prolonged use, the cutting tip 12 is preferably re-sharpened rather than the drill bit 16 being discarded. The re-sharpening of the cutting tip 12 generally results in a decrease in the length of the fluted portion 14, thus lessening the distance D1 separating the cutting tip 12 from the locating ring 22. As such, after the re-sharpening procedure has been completed, the position of the locating ring 22 upon the shank portion 18 must be adjusted to re-achieve the proper distance D1 separating the cutting tip 12 from the locating ring 22. As also previously explained, in the prior art, the re-sharpening of the cutting tip 12 as well as the re-positioning of the locating ring 22 upon the shank portion 18 is typically done manually or semi-manually through the use of various independent conventional grinding and measurement systems and techniques. However, the use of these prior art methods, in addition to being time-consuming and costly, often does not facilitate the required level of accuracy in the finished configuration of the cutting tip 12 and/or the distance D1 separating the cutting tip 12 from the locating ring 22.

Drill Bit Container

As further seen in FIG. 1, for processing by the present apparatus 10, drill bits 16 (including the locating rings 22 positioned thereupon) are preferably stored in a drill bit container 26. The drill bit container 26 comprises a base 28 having a cover 30 pivotally connected thereby via a pair of hinges 32. To secure the cover 30 to the base 28, a first tab 34 of the cover 30 mates with a second tab 36 of the base 28. As such, the drill bit container 26 can assume either an opened position or a closed position, and is shown in FIG. 1 in its opened position.

The base 28 of the drill bit container 26 defines a generally flat top surface 38 having a plurality of drill bit receiving holes 40 disposed therein. The drill bit receiving holes 40 are specifically arranged in the top surface 38, and are provided in alternately off-set rows for purposes of reducing the overall size requirement for the drill bit container 26. Each of the drill bit receiving holes 40 has a diameter which is large enough to allow the shank portion 18 of the drill bit 16 to pass therethrough. However, each drill bit receiving hole 40 is smaller in diameter than the locating ring 22. As such, the insertion of the shank portion 18 axially into a respective one of the holes 40 is limited by the abutment of the lower surface of the locating ring 22 against the top surface 38 of the base 28. As such, the majority of the shank portion 18 resides below the top surface 38, with the fluted portion 14 projecting generally perpendicularly upwardly therefrom. Although the particular container 26 illustrated herein is manufactured by Tycom Corp. of Santa Ana, Calif., the assignee of this patent application, those of ordinary skill in the art will recognize that other containers 26 manufactured by alternative companies may be utilized in the present invention and are clearly contemplated herein.

The drill bit container 26 used in conjunction with the apparatus 10 may be of a standard design, or alternatively of any special design as required by a customer. Additionally, the drill bits 16 need not be inserted into respective ones of the receiving holes 40 such that the fluted portions 14 thereof project generally perpendicularly upwardly from the top surface 38. Rather, as further seen in FIG. 1, the fluted portion 14 of each drill bit 16 may be axially inserted into a respective one of the holes 40, with such insertion being limited by the abutment of the upper surface of the locating ring 22 against the top surface 38 of the base 28. In this orientation, the shank portion 18 of the drill bit 16 will project generally perpendicularly upwardly from the top surface 38.

Apparatus Housing

Referring now to FIGS. 2 and 3, the apparatus 10 of the present invention comprises a base table or housing 42 which defines a planar top surface 44 having a generally rectangular configuration. The housing 42 is preferably modularly configured, and includes a center section 42a and a pair of identically configured end sections 42b, 42c which are abutted against respective ones of opposed sides of the center section 42a. The top surfaces of the center and end sections 42a, 42b, 42c collectively define the top surface 44. Attached to the front of the housing 42, and more particularly respective ones of the end sections 42b, 42c thereof, is a pair of control panels 46, at least one of which houses a programmable control device, the use of which will be described in more detail below. Attached to the top surface of the center section 42a is a rectangularly configured support plate 50. Additionally, attached to the top surface of each of the end sections 42b, 42c—is a pair of generally rectangular support blocks 48, i.e., two (2) pairs of the support blocks 48 are attached to the top surface 44. One pair of opposed sides of the support plate 50 are abutted against respective pairs of the support blocks 48, with the remaining pair of opposed sides being substantially flush with respective ones of the longitudinal sides of the center section 42a of the housing 42. The support blocks 48 and support plate 50 each define generally planar top surfaces.

Cassette Trays

Referring now to FIGS. 2, 2a and 3, the apparatus 10 of the present invention comprises a pair of elongate, generally rectangular cassette trays 54 which are attached to the generally planar top surfaces of respective pairs of the support blocks 48. As seen in FIGS. 2 and 3, the width dimensions of the identically configured cassette trays 54 are substantially identical to those of the support blocks 48 to which they are attached. In this respect, the longitudinal and lateral sides of each cassette tray 54 are substantially flush with the corresponding sides of the support blocks 48 to which it is attached.

In the apparatus 10, each cassette tray 54 is a frame having a plurality of generally rectangular, equally sized openings 56 formed therein. The openings 56 are each defined by frame walls 58 which project upwardly from a base 60. Importantly, each of the openings 56 has a configuration which is complementary to that of the base 28 of the drill bit container 26. In this respect, as seen in FIG. 2a, each opening 56 is sized to partially receive the base 28 of a drill bit container 26 and hold the same in a set position. As also seen in FIG. 2a, drill bit containers 26 may be placed within the openings 56 in a pattern wherein an opening 56 adjacent the base 28 of each drill bit container 26 is used to accommodate the cover 30 when the drill bit container 26 is opened. However, those of ordinary skill in the art will recognize that the bases 28 of drill bit containers 26 may be inserted into all of the openings 56 at one time provided that the covers 30 are detached therefrom.

Loader Assembly

Referring now to FIGS. 2, 3, 4, 4a and 4b, the apparatus 10 of the present invention includes a robotic loader assembly 62 which is movably or rotatably attached to the support plate 50 and is used to remove drill bits 16 one at a time from within the drill bit containers 26 positioned upon the cassette trays 54, and return each drill bit 16 to the precise location within the drill bit container 26 from which it was removed subsequent to the re-sharpening of its cutting tip 12 and re-positioning of its locating ring 22. The loader assembly 62 is also used to transport drill bits 16 between various assemblies of the apparatus 10, as will be described in more detail below.

The loader assembly 62 comprises a robotic arm having a generally L-shaped first arm segment 64 which is rotatably attached to a base member 65 of the loader assembly 62. The base member 65 is itself attached to the top surface of the support plate 50 in relative close proximity to the back edge thereof. As seen in FIG. 2, the first arm segment 64 is rotatable relative to the base member 65 about a first loader axis LA1 which extends in generally perpendicular relation to the top surface of the support plate 50. In addition to the first arm segment 64, the robotic arm comprises a second arm segment 66 which is rotatably connected to the distal end of the horizontally extending portion of the first arm segment 64 and is rotatable about a second loader axis LA2 relative thereto. As further seen in FIG. 2, the second loader axis LA2 extends in generally parallel relation to the first loader axis LA1.

In addition to the first and second arms segments 64, 66, the robotic arm of the loader assembly 62 comprises a third arm segment 67 which is rotatably connected to the end of the second arm segment 66 opposite that connected to the first arm segments 64. The third arm segment 67 is rotatable about a third loader axis LA3 relative to the second arm segment 66. The third loader axis LA3 itself extends in generally parallel relation to the first and second loader axes LA1, LA2. In addition to being rotatable about the third loader axis LA3, the third arm segment 67 of the robotic arm is movable linearly or vertically (i.e., upwardly and downwardly) therealong. Though not shown, the robotic arm of the loader assembly 62 includes internal components which allows the first arm segment 64 to be rotated about the first loader axis LA1, the second arm segment 66 to be rotated about the second loader axis LA2, and the third arm segment 67 to be rotated about or moved along the third loader axis LA3.

In addition to the robotic arm, the loader assembly 62 comprises a gripper 70 which is attached to the lower end of the third arm segment 67 of the robotic arm. The gripper 70 comprises a gripper housing 71a having a pair of gripper arms 71b extending downwardly therefrom in spaced, generally parallel relation to each other. The gripper 70 further comprises a pair of shaft members 72 which are pivotally connected to respective ones of the gripper arms 71b. More particularly, each of the shaft members 72 extends partially between a spaced pair of flange portions defined by a respective gripper arm 71b. Extending longitudinally through each shaft member 72 is an aperture 74, at least a portion of which has a diameter slightly exceeding the diameter of the shank portion 18 of the drill bit 16. Fluidly connected to each of the apertures 74 is an elongate, flexible vacuum tube 76 of the loader assembly 62 which is also connected to a vacuum pump thereof. When activated, the vacuum pump facilitates the creation of a vacuum within each of the apertures 74 for reasons which will be described in more detail below.

In addition to the shaft members 72, the gripper 70 comprises an actuator member 78 which is used to facilitate the reciprocal pivotal movement of the shaft members 72 relative to the third loader axis LA3. The actuator member 78 preferably comprises a pneumatic cylinder, the body of which is pivotally connected to one of the gripper arms 71b. Extending axially from the body is a piston rod, the distal end of which is mechanically coupled to the pivot pin used to pivotally connected the shaft members 72 to the gripper arms 71b and each other.

As seen in FIGS. 4 and 4a, the shaft members 72 of the gripper 70, in addition to having the capacity to rotate about and travel vertically along the third loader axis LA3 by virtue of the connection of the gripper 70 to the third arm segment 67, may also be pivoted approximately 90° to a horizontal orientation by the actuator member 78 so as to extend along a gripper axis GX which is generally perpendicular to the third loader axis LA3. In this respect, the advancement of the piston rod of the actuator member 78 from the body thereof facilitates the upward pivotal movement of the shaft members 72 from a vertical orientation extending along the third loader axis LA3 (as shown in FIGS. 4 and 4b) to a horizontal orientation extending along the gripper axis GX (as shown in FIG. 4a). Conversely, the retraction of the piston rod back into the cylinder facilitates the downward pivotal movement of the shaft members 72 and the return thereof to their extension along the third loader axis LA3. The importance of the ability to extend the shaft members 72, and in particular their apertures 74, along the gripper axis GX will be described in more detail below.

As is apparent from the foregoing description of the loader assembly 62, the shaft members 72 of the gripper 70 thereof may be maneuvered to a position above virtually any location upon the top surface 44 of the housing 42 by the robotic arm. Importantly, the configuration of the cassette trays 54 and their attachment to the support blocks 48 is such that a drill bit 16 disposed within any drill bit receiving hole 40 of a drill bit container 26 stored within any opening 56 of the cassette trays 54 is accessible by the gripper 70 of the loader assembly 62, and in particular either of the shaft members 72 thereof.

As further seen in FIG. 4, the "grasping" of a drill bit 16 by the loader assembly 62 when the drill bit 16 is vertically oriented with the fluted portion 14 thereof projecting upwardly is accomplished by initially maneuvering one of the shaft members 72 via the robotic arm such that the aperture 74 extending therethrough is coaxially aligned with the fluted portion 14 of the drill bit 16. Thereafter, the shaft member 72 is moved vertically downward along the third loader axis LA3 and advanced over the fluted portion 14 and tapered region 20 of the drill bit 16, with such downward advancement being terminated when the shaft member 72 contacts the locating ring 22 of the drill bit 16. Thereafter, the vacuum pump of the loader assembly 62 is activated so as to create negative pressure within the aperture 74. Such negative pressure or vacuum causes the drill bit 16 to be retained within the shaft member 72 when the same is moved upwardly along or rotated about the third loader axis LA3 by the third arm member 67 of the robotic arm. As will be recognized, the equalization of pressure within the aperture 74 as occurs when the vacuum pump is deactivated results in the immediate release of the drill bit 16 from within the shaft member 72.

The "grasping" of the drill bit 16 by the loader assembly 62 when the drill bit 16 is vertically oriented with the shank portion 18 thereof projecting upwardly is accomplished in the previously described manner as well. In this respect, one of the shaft members 72 of the gripper 70 is initially maneuvered such that the aperture 74 extending therethrough is coaxially aligned with the shank portion 18 of the drill bit 16. Thereafter, the shaft member 72 is moved vertically downward along the third loader axis LA3 and advanced over the shank portion 18, with such downward advancement being terminated when the shaft member 72 contacts the locating ring 22 of the drill bit 16. Once again, the vacuum pump of the loader assembly 62 is activated so as to create negative pressure within the aperture 74 which causes the drill bit 16 to be retained within the shaft member 72. The equalization of pressure within the aperture 74 resulting from the deactivation of the vacuum pump facilitates the immediate release of the drill bit 16 from within the shaft member 72.

As is apparent from FIG. 4a, the "grasping" of a drill bit 16 by the loader assembly 62 when the drill bit 16 is horizontally oriented is accomplished by maneuvering one of the shaft members 72 via the robotic arm such that when the shaft member 72 is pivoted upwardly by the actuator member 78, the gripper axis GX is coaxially aligned with the drill bit 16, and in particular the fluted portion 14 thereof. Thereafter, the shaft member 72 is moved horizontally and advanced over the fluted portion 14 and tapered region 20 of the drill bit 16, with such horizontal advancement being terminated when the shaft member 72 contacts the locating ring 22 of the drill bit 16. The activation of the vacuum pump of the loader assembly 62 retains the drill bit 16 within the shaft member 72 in the previously described manner.

Primary Cleaning Assemblies

Referring now to FIGS. 2 and 3, the apparatus 10 of the present invention further includes a pair of identically configured primary cleaning assemblies 80 which are each used to facilitate the cleaning of the cutting tip 12 of a drill bit 16 prior to the grinding or re-sharpening thereof. Although not by limitation, in the preferred embodiment, the primary cleaning assemblies 80 each comprise a rectangularly configured bath or container 82 which is attached to a respective one of the support blocks 48, and more particularly the longitudinal side thereof disposed adjacent the support plate 50. Each of the baths 82 contains a quantity of cleaning putty 84.

In the apparatus 10, if a drill bit 16 has initially been grasped by a shaft member 72 of the gripper 70 via the advancement of the shaft member 72 over the shank portion 18, the cutting tip 12 of the drill bit 16 is cleaned immediately subsequent to the removal of the drill bit 16 from within a drill bit container 26. Such cleaning is accomplished by maneuvering the loader assembly 62 such that the shaft member 72, and more particularly the fluted portion 14 of the drill bit 16 protruding therefrom, is vertically aligned with the cleaning putty 84 of one of the primary cleaning assemblies 80. Thereafter, the shaft member 72 is moved downwardly along the third loader axis LA3 by the third arm segment 67 of the robotic arm so as to facilitate the insertion of the cutting tip 12 of the drill bit 16 into the quantity of cleaning putty 84. The shaft member 72 is then moved upwardly along the third loader axis LA3 by the third arm segment 67 so as to facilitate the removal of the cutting tip 12 from within the cleaning putty 84. It will be recognized by those skilled in the art that alternative cleaning systems such as laser systems; carbon dioxide systems; fluidic bath systems and the like are expressly contemplated herein.

As will be recognized, if the drill bit 16 has been grasped by one of the shaft members 72 of the gripper 70 in the manner shown in FIG. 4 (i.e., the shaft member 72 is advanced over the fluted portion 14 of the drill bit 16), the drill bit 16 must be inverted to accomplish the cleaning of the cutting tip 12 thereof via one of the primary cleaning assemblies 80. Such inversion is accomplished through the use of one of the inversion assemblies of the apparatus 10 as will be described in more detail below.

Inversion Assemblies

Referring now to FIGS. 2, 3 and 5, the apparatus 10 of the present invention further includes a pair of identically configured inversion assemblies 85 which, as will be discussed in more detail below, are each used to facilitate the selective inversion or flipping of a drill bit 16. The inversion assemblies 85 each comprise a base member 86 which is attached to the top surface of the support plate 50. Rotatably connected to the base member 86 is an inversion arm 87 which extends in a generally horizontal direction. The inversion arm 87 is rotatable relative to the base member 86 via a rotary actuator (not shown) disposed therewithin. Attached to the distal end of the inversion arm 87 is a holder block 88 having an aperture extending therethrough which is sized to have a diameter slightly exceeding that of the locating ring 22 positioned upon a drill bit 16.

Each inversion assembly 85 further comprises an elongate locking pin 89 which is movably attached to the base member 86 and defines a distal end which is reciprocally movable into and out of the aperture extending through the holder block 88. Also attached to the base member 86 is an air stream generator 90 which is adapted to direct a high pressure air stream against the cutting tip 12 of a drill bit 16 for reasons which will be discussed in more detail below.

As indicated above, if the shaft member 72 of the gripper 70 has initially been advanced over the fluted portion 14 of a drill bit 16 and into contact with the locating ring 22, the drill bit 16 must be inverted via one of the inversion assemblies 85 to allow the cutting tip 12 thereof to be initially cleaned by one of the primary cleaning assemblies 80. Such inversion is accomplished by maneuvering the shaft member 72 via the robotic arm of the loader assembly 62 such that the shank portion 18 of the drill bit 16 protruding therefrom is coaxially aligned with the aperture extending through the holder block 88 of one of the inversion assemblies 85. Thereafter, the shaft member 72 is moved downwardly by the third arm segment 67 of the robotic arm along the third loader axis LA3 so as to facilitate the insertion of the shank portion 18 into the aperture of the holder block 88.

After the drill bit 16 has been inserted into the holder block 88, the operation of the inversion assembly 85 is initiated by the actuation of the locking pin 89 so as to cause the same to move into engagement with the shank portion 18 of the drill bit 16. As will be recognized, the engagement of the distal end of the locking pin 89 to the shank portion 18 effectively locks the drill bit 16 within the holder block 88. The equalization of the pressure level within the shaft member 72 and retraction thereof from the drill bit 16 (i.e., upward movement of the shaft member 72 along the third loader axis LA3) occurs subsequent to the engagement of the locking pin 89 to the shank portion 18 of the drill bit 16.

As will be recognized, subsequent to the locking of the drill bit 16 within the holder block 88 and retraction of the gripper 70 therefrom, the fluted portion 14 of the drill bit 16 projects generally vertically upwardly. Thereafter, the inversion arm 87 of the inversion assembly 85 is rotated approximately 180° by the rotary actuator so as to cause the shank portion 18 of the drill bit 16 to be directed generally vertically upwardly. Subsequent to such inversion, the robotic arm of the loader assembly 62 is used to maneuver one of the shaft members 72 of the gripper 70 such that the aperture 74 thereof is coaxially aligned with the shank portion 18 of the drill bit 16. The shaft member 72 is then moved downwardly along the third loader axis LA3 by the third arm segment 67 and advanced over the shank portion 18 of the drill bit 16. Upon the creation of a vacuum within the aperture 74 sufficient to maintain the drill bit 16 therewithin, the locking pin 89 of the inversion assembly 85 is retracted so as to remove the distal end thereof from its engagement to the shank portion 18. Such disengagement allows the drill bit 16 to be removed from within the holder block 88 by the upward movement of the shaft member 72 along the third loader axis LA3. As will be recognized, upon the removal of the drill bit 16 from within the holder block 88, the fluted portion 14 of the drill bit 16 protrudes from the shaft member 72, thus allowing the cutting tip 12 to be cleaned via one of the primary cleaning assemblies 80 in the above-described manner.

In the apparatus 10 of the present invention, each drill bit 16 must be inverted via one of the inversion assemblies 85 subsequent to the cutting tip 12 thereof being cleaned via one of the primary cleaning assemblies 80 in the above-described manner. In this respect, after the cutting tip 12 has been initially cleaned, the drill bit 16 must be grasped by the gripper 70 of the loader assembly 62 such that the shank portion 18 rather than the fluted portion 14 protrudes from one of the shaft members 72.

The inversion process following the initial cleaning of the cutting tip 12 is accomplished by maneuvering the shaft member 72 having the just cleaned drill bit 16 therewithin such that the fluted portion 14 of the drill bit 16 is coaxially aligned with the aperture extending through the holder block 88 of one of the inversion assemblies 85. Thereafter, the shaft member 72 is moved downwardly along the third loader axis LA3 by the third arm segment 67 of the robotic arm so as to facilitate the insertion of the fluted portion 14 into the aperture of the holder block 88. After the fluted portion 14 has been advanced through the aperture of the holder block 88, the locking pin 89 is actuated so as to cause the distal end thereof to extend into engagement with the shank portion 18 of the drill bit 16. As explained above, the engagement of the distal end of the locking pin 89 to the shank portion 18 effectively locks the drill bit 16 within the holder block 88. The shaft member 72 is then moved upwardly along the third loader axis LA3 by the third arm segment 67 so as to retract the same from the drill bit 16.

As will be recognized, when the drill bit 16 is locked within the holder block 18 and gripper 70 of the loader assembly 62 retracted therefrom, the shank portion 18 is directed generally vertically upwardly, with the fluted portion 14 being directed generally vertically downwardly. The air stream generator 90 of the inversion assembly 85 is then activated, and is caused to direct a high pressure air stream against the cutting tip 12 of the drill bit 16 in the manner shown in FIG. 5. Importantly, the impingement of air against the cutting tip 12 effectively removes any residual cleaning putty therefrom. Thereafter, the inversion arm 87 of the inversion assembly 85 is rotated approximately 180° so as to cause the fluted portion 14 to be directed generally vertically upwardly.

Subsequent to the inversion of the drill bit 16, one of the shaft members 72 of the gripper 70 is maneuvered such that the aperture 74 thereof is coaxially aligned with the fluted portion 14. The shaft member 72 is then moved downwardly along the third loader axis LA3 via the third arm segment 67 of the robotic arm and advanced over the fluted portion 14. The vacuum is then created within the aperture 74 at a level sufficient to maintain the drill bit 16 therewithin. Thereafter, the locking pin 89 of the inversion assembly 85 is retracted or disengaged from the shank portion 18, thus allowing the drill bit 16 to be removed from within the holder block 88 by the upward movement of the shaft member 72 along the third loader axis LA3 by the third arm segment 67 of the robotic arm. As will be recognized, upon the removal of the drill bit 16 from the inversion assembly 85, the shank portion 18 thereof protrudes from one of the shaft members 72 of the gripper 70.

Workhead Assemblies

Referring now to FIGS. 2, 3, 6 and 6*a*, the apparatus 10 further comprises an identically configured pair of workhead assemblies 96, each of which is used to transport a drill bit 16 between other assemblies of the apparatus 10 as will be described in more detail below. Each of the workhead assemblies 96 comprises a generally rectangular base member 98 which is reciprocally moveable along a base member axis BX (as shown in FIG. 3). The base member axes BX of the workhead assemblies 96 extend in co-planar, parallel relation to each other.

The movement of the base member 98 along its base member axis BX is facilitated by an actuator 100 of the workhead assembly 96. As best seen in FIG. 2, the actuator 100 of each workhead assembly 96 preferably comprises a pneumatic cylinder, the body of which is attached to the top surface 44 of the housing 42 and disposed underneath a respective one of the cassette trays 54. Extending axially from the body is an elongate piston rod, the distal end of which is attached to the base member 98. As will be recognized, the advancement of the piston rod of the actuator 100 from within the body thereof results in the movement of the base member 98 along its base member axis BX away from the cassette trays 54. Conversely, the retraction of the piston rod of the actuator 100 into the body thereof results in the movement of the base member 98 along its base member axis BX toward the cassette trays 54. Those of ordinary skill in the art will recognize that the actuator 100 used to facilitate the movement of the base member 98 along its base member axis BX may comprise devices other than for a pneumatic cylinder.

In addition to the base member 98 and actuator 100, each workhead assembly 96 comprises a swivel member 102 having a swivel member housing 103 which is rotatably connected to the base member 98 via a bearing 101. The swivel member 102 is rotatable about a swivel member axis which extends in generally perpendicular relation to the base member axis BX, and thus extends in generally parallel relation to the first, second and third loader axis LA1, LA2, LA3. The rotation of the swivel member 102 relative to the base member 98 is accomplished by the selective activation of a first stepper motor 104 thereof which extends from the swivel member housing 103. The rotation of the swivel member 102 relative to the base member 98 may alternatively be accomplished through the use of a pneumatic cylinder rather than the first stepper motor 104.

Each workhead assembly 96 further comprises a collet member 106 which is attached to the swivel member 102. The collet member 106 includes a collet member housing 107 having a cylindrically configured collet shaft 108 extending therefrom. Attached to the distal end of the collet shaft 108 is a locking sleeve 111 which accommodates a collet head 110. In the workhead assembly 96, the collet shaft 108, and hence the collet head 110, is reciprocally movable relative the collet member housing 107 along a collet axis CX (shown in FIG. 6). In addition to being movable along the collet axis CX, the collet shaft 108 is rotatable thereabout. The movement of the collet shaft 108 along and about the collet axis CX is facilitated by a second stepper motor 112 of the collet member 106 which extends from the collet member housing 107 thereof. The collet axis CX extends in generally parallel relation to the plane of the top surface 44 of the housing 42 throughout the rotation of the swivel member 102. The first and second stepper motors 104, 112 may comprise servo motors, or linear servo motors. Since the second stepper motor 112 facilitates the rotation of the collet shaft 108 about the collet axis CX, such motor provides a prescribed rotational positioning of the cutting tip 12 of the drill bit 16 as will be described in more detail below.

Referring now to FIGS. 4, 4*a*, 6 and 6*a*, in the apparatus 10, a drill bit 16 is insertable into and removable from within the collet head 110 of each workhead assembly 96 by the loader assembly 62. In this respect, the collet head 110 is sized and configured to slidably receive the shank portion 18 of a drill bit 16, with the advancement of the shank portion 18 into the collet head 110 being limited by a stopper within the collet head 110 which is adjusted so that only about one-eighth of an inch of the shank portion 18 of the drill bit 16 is inserted into and locked within the collet head 110. Since the collet axis CX extends horizontally, a drill bit 16 held vertically within a shaft member 72 of the gripper 70 in the above-described manner must be pivoted to extend along the gripper axis GX (as shown in FIG. 4*a*) prior to being insertable into the collet head 110. In addition to the shaft member 72 being pivoted by the actuator member 78 to facilitate the extension of the drill bit 16 along the gripper axis GX, the shaft member 72 must also be maneuvered by the loader assembly 62 such that the gripper axis GX is coaxially aligned with the collet axis CX in order for the shank portion 18 to be insertable into the collet head 110. The gripper axis GX must also be coaxially aligned with the collet axis CX for the shaft member 72 to be advanced over the fluted portion 14 of the drill bit 16 and into contact with the locating ring 22 to facilitate the removal of the drill bit 16 from within the collet head 110.

Figure 6A:
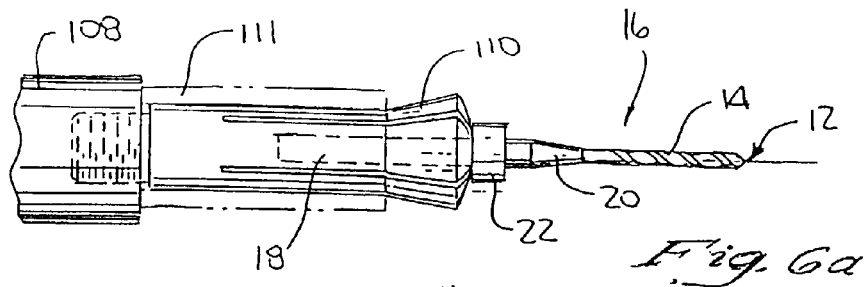
FIG. 6a is a partial side elevational view of the collet member of the workhead assembly shown in FIG. 6.
Figure 6:
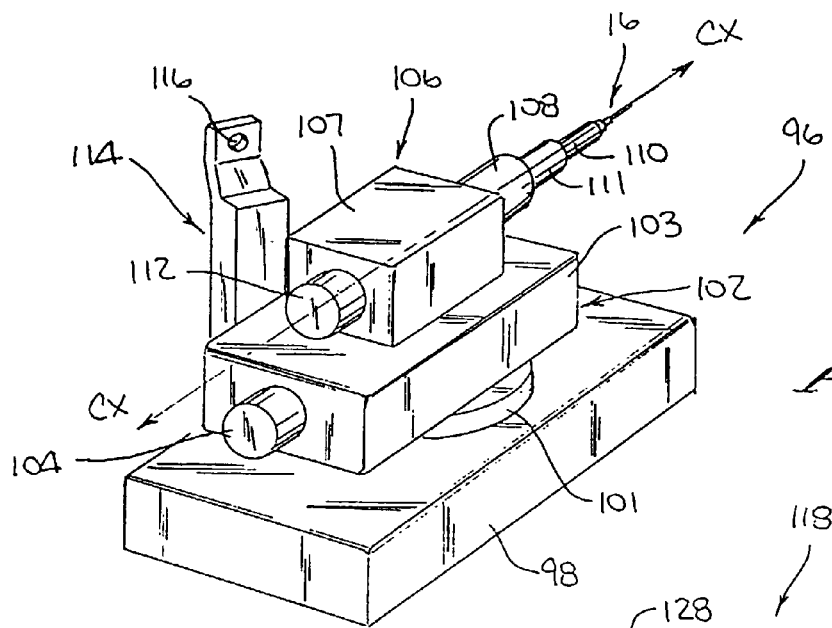
FIG. 6 is a perspective view of one of the workhead assemblies of the present re-sharpening apparatus.

As best seen in FIG. 6, each workhead assembly 96 further comprises an elongate support member 114 which is attached to the base member 98. Extending through the support member 14 in close proximity to the top end thereof is an aperture 116 which is sized and configured to slidably receive the locking sleeve 111. As will be described in more detail below, the locking sleeve 111 is slidably advanced into the aperture 116 as part of the process of re-sharpening the cutting tip 12 of the drill bit 16 so as to allow the support member 14 to guide and prevent excessive vibration of the drill bit 16 within the collet head 110 during the re-sharpening process.

Optical Assemblies

Figure 7:
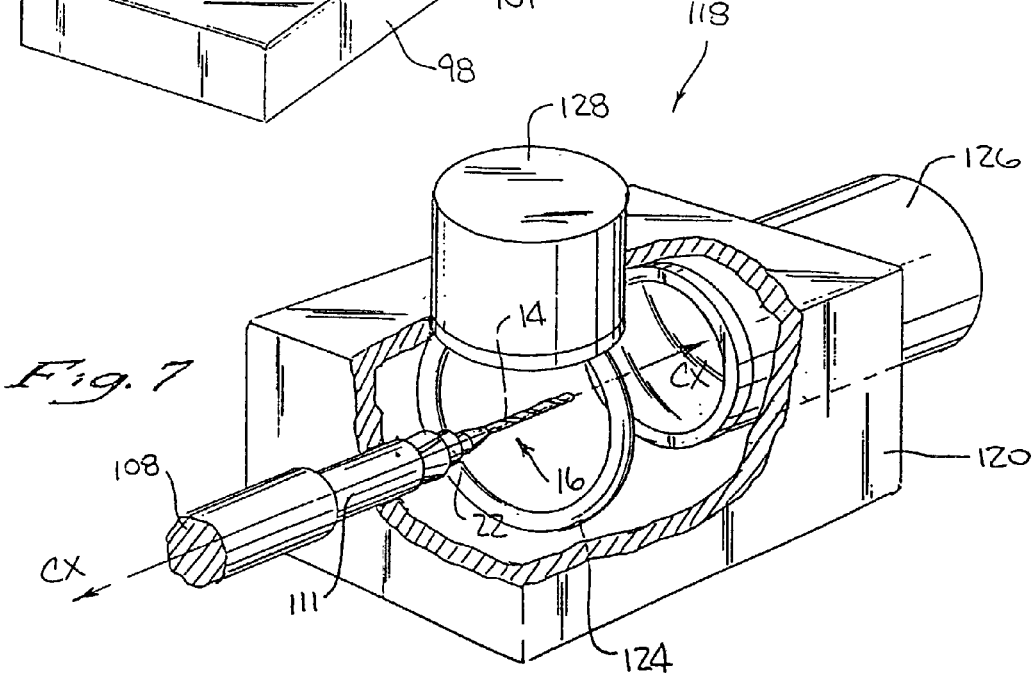
FIG. 7 is a cut-away perspective view of one of the optical assemblies of the present re-sharpening apparatus, illustrating the manner in which a drill bit is inserted into the interior thereof via one of the workhead assemblies.

Referring now to FIGS. 2, 3 and 7, the apparatus lo further comprises a pair of vision or optical assemblies 118, each of which is adapted to generate images preferably digital images used to verify the identity and geometry of the drill bit as well as conduct initial and final inspections or evaluations of the cutting tip 12 and fluted portion 14 of a drill bit 16 inserted thereinto, as will be described in more detail below. The optical assemblies 118 are each attached to the top surface 44 of the housing 42 and are disposed under respective ones of the cassette trays 54.

As best seen in FIG. 7, each of the optical assemblies 118 comprises an optical housing 120 having a circularly configured opening 122 disposed within one of the sidewalls thereof. The opening 122 is sized and configured to receive the locking sleeve 111 of one of the workhead assemblies 96. When the optical assemblies 118 are mounted to the housing 42, the distance separating the opening 122 of each optical housing 120 from the top surface 44 of the housing 42 is such that the collet axis CX of one of the workhead assemblies 96 may be coaxially aligned with the opening 122. Such alignment is needed to allow a drill bit 16 held within the collet head 110 of a workhead assembly 96 to be insertable into the interior of the optical housing 120 via the opening 122 upon the movement of the base member 98 of the workhead assembly 96 along the base member axis BX.

Disposed within the interior of the optical housing 120 is a circularly configured illumination ring or array 124 which is coaxially aligned with the opening 122. The illumination array 124 preferably comprises a sequential ring of LED's which emit red light. Attached to the sidewall of the optical housing 120 opposite that including the opening 122 disposed therein is a front camera 126 of the optical assembly 118. The front camera 126 protrudes into the interior of the optical housing 120, and includes a circularly configured lens which is coaxially aligned with both the opening 122 and the illumination array 124. In addition to the front camera 126, each optical assembly 118 includes a top camera 128 which is attached to the top of the optical housing 120. Like the front camera 126, the top camera 128 protrudes into the interior of the optical housing 120, and includes a circularly configured lens which extends in generally perpendicular relation to the collet axis CX when a drill bit 16 is inserted into the interior of the optical housing 120 by a workhead assembly 96. Although various optical systems are contemplated herein, a preferred system is manufactured by Volution, Inc. of San Diego, Calif.

Grinding Assemblies

Referring now to FIGS. 2, 3 and 8, the apparatus 10 further comprises a pair of grinding assemblies 130 which are attached to the top surface 44 of the housing 42. Each of the grinding assemblies 130 comprises a grinder mount 132 which has a generally U-shaped configuration. Movably attached to the grinder mount 132 and disposed between the end portions defined thereby are first and second grinder motors 134, 136. Rotatably connected to the first grinder motor 134 is a first circularly configured grinding head 138, while rotatably connected to the second grinder motor 136 is a second circularly configured grinder head 140.

In the apparatus 10, the grinding faces of the first and second grinder heads 138, 140 typically do not extend in perpendicular relation to the top surface 44 of the housing 42, but rather are angularly off-set relative thereto. In each grinding assembly 130, the angular orientations of the grinding faces of the first and second grinder heads 138, 140 relative to the top surface 44 may be selectively adjusted. In this respect, the grinder mount 132 includes a pair of accurately shaped slots 142 disposed within respective ones of the end portions defined thereby. The attachment of the first and second grinder motors 134, 136 to the grinder mount 132 is facilitated by the receipt of mounting shafts extending from each of the first and second grinder motors 134, 136 into respective ones of the slots 142. The tightening of a clamping member 144 disposed on the distal end of at least one of the mounting shafts maintains the mounting shafts in a desired location within the slots 142. As will be recognized, the loosening of the clamping member 144 allows the location of the mounting shafts within the slots 142 to be selectively adjusted as needed to alter the angular orientations of the grinding faces of the first and second grinder heads 138, 140 relative to the top surface 44 of the housing 42. In each grinding assembly 130, the first and second grinder motors 134, 136 are interconnected, and thus move in unison when the angular orientations of the grinding faces of the first and second grinder heads 138, 140 are adjusted in the above-described manner.

Figure 13:
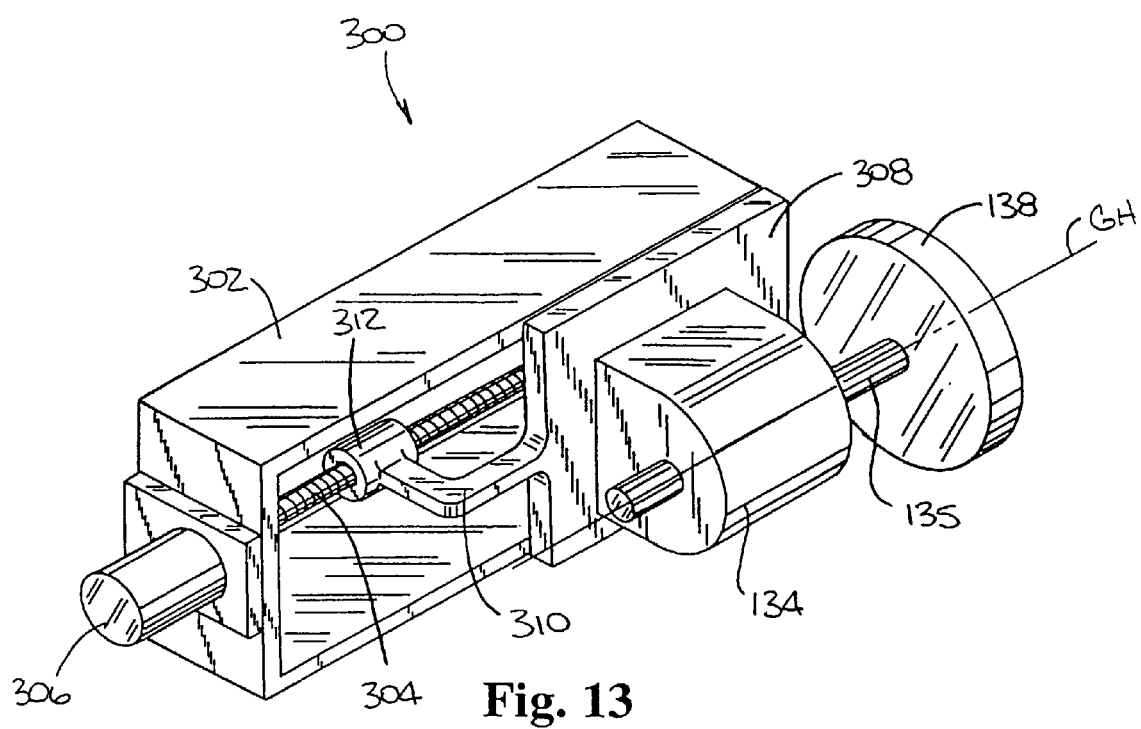
FIG. 13 is a rear perspective view of one of the two adjustment units which may be integrated into each of the two grinding assemblies of the present re-sharpening apparatus.

Referring now FIG. 13, each of the grinding assemblies 130 of the apparatus 10 may be optionally outfitted with a pair of adjustment mechanisms 300. Each of the adjustment mechanisms 300 comprises a housing 302 which has a generally rectangular configuration and defines a hollow interior. Extending longitudinally through the hollow interior of the housing 302 is an elongate ball screw 304 which is rotatably mounted within each of the opposed, lateral sidewalls of the housing 302. Mechanically coupled to one end of the ball screw 304 is a stepper motor 306 which is itself mounted to the outer surface of one of the lateral sidewalls of the housing 302. The stepper motor 306, when activated, is operative to selectively rotate the ball screw 304 in either a first direction or a second direction which is opposite the first direction.

Each adjustment mechanism 300 further comprises a linear bearing 308 which has a generally rectangular configuration and includes a cantilever member 310 mounted to one of the opposed lateral sides thereof. The cantilever member 310 is itself cooperatively engaged to the ball screw 304 via a ball nut 312 disposed on the end thereof opposite that attached to the linear bearing 308. As shown in FIG. 13, mounted to the outer surface of the linear bearing 308 is the first grinder motor 134. Extending from the first grinder motor 134 is a first rotatable motor shaft 135 which includes the first grinder head 138 attached to the distal end thereof. As will be recognized, the first motor shaft 135 facilitates the rotatable connection of the first grinder head 138 to the first grinder motor 134.

Due to the mounting of the first grinder motor 134 to the linear bearing 308, the activation of the stepper motor 306 is operative to selectively move the first grinder motor 134, and hence the first grinder head 138, back and forth along the grinder head axis GH shown in FIG. 13. In this respect, the rotation of the ball screw 34 in the first direction facilitates the movement of the first grinder head 138 along the grinder head axis GH in a direction away from the stepper motor 306. Conversely, the rotation of the ball screw 304 in the second direction opposite the first direction facilitates the movement of the first grinder head 138 along the grinder head axis GH in a direcevel toward the stepper motor 306. The advantages attendant to the ability to move the first grinder head 138 back and forth along the grinder head axis GH will be discussed in more detail below. Though not shown, the adjustment mechanism 300 may further include a spring which is disposed within the interior of the housing 302 and cooperatively engaged Lo the linear bearing 308 for purposes of applying a pre-load thereto.

As will be recognized, in the alternative grinding assembly 130 including the adjustment mechanisms 300, the second grinder motor 136 is mounted to the outer surface of the linear bearing 308 of the other, remaining adjustment mechanism 300. The adjustment mechanisms 300, and in particular the housings 300 thereof, may be attached to a modified version of the grinder mount 132 which is sized and configured to accommodate the same.

Secondary Cleaning Assemblies

Referring now to FIGS. 2, 3 and 8a, the apparatus 10 further comprises a pair of secondary cleaning assemblies 180 which are attached to the top surface 44 of the housing 42 outwardly of respective ones of the cassette trays 54. The secondary cleaning assemblies 180 are used to facilitate the cleaning of the cutting tip 12 of a drill bit 16 prior to the final inspection thereof by one of the optical assemblies 118 as will be described in more detail below.

Each of the secondary cleaning assemblies 180 comprises a base member 182 which is attached to the top surface 44 of the housing 42. Movably attached to the base member 182 is an elongate conveyor bar 184 which includes a pair of conveyor rollers 186 rotatably connected to a common side thereof in relative close proximity to respective ones of the opposed ends thereof. Attached to one of the conveyor rollers 186 is an indexing wheel 188, while extending about the conveyor rollers 186 is a continuous conveyor belt 190. Additionally, attached to the base member 182 is an indexing member 192 which extends upwardly toward the indexing wheel 188. As seen in FIG. 8a, the conveyor belt 190 is provided with quantities of cleaning putty 194 thereon, with each such quantity of cleaning putty 194 being disposed between a respective pair of ribs formed on the conveyor belt 190.

In each secondary cleaning assembly 180, the base member 182 is operable to selectively actuate the conveyor bar 184, and hence the conveyor belt 190, between a retracted position as shown in FIG. 8a and an extended position as shown in phantom in FIG. 8a. When the conveyor belt 190 is in the extended position, one of the quantities of cleaning putty 194 disposed thereon is in general horizontal alignment with the axis of the opening 122 of a respective one of the optical assemblies 118. When the conveyor belt 190 is in its retracted position, the quantities of cleaning putty 194 disposed thereon are oriented substantially below the axis of the opening 122. Importantly, the movement of the conveyor belt 190 from its extended position to its retracted position results in the engagement of the distal end of the indexing member 192 to the indexing wheel 188 in a manner facilitating the indexing of the conveyor belt 190 a prescribed incremental distance. This movement of the conveyor belt 190 effectively places a successive quantity of cleaning putty 194 into horizontal alignment with the collet axis CX when the same is coaxially aligned with the opening 122 of the associated optical assembly 118.

Bumping Assembly

Referring now to FIGS. 2, 3 and 9, the apparatus 10 further comprises a bumping assembly 146 which is attached to the top surface 44 of the housing 42 substantially intermediate the cassette trays 54. The bumping assembly 146 is used to facilitate the re-positioning of the locating ring 22 upon a drill bit 16 if needed subsequent to the completion of the re-sharpening of the cutting tip 12 of the drill bit 16. The complete structure and manner of operation of the bumping assembly 146 is described in detail in U.S. Pat. No. 5,472,298 entitled LOCATING RING POSITIONING APPARATUS FOR RE-SHARPENED DRILL BIT issued Dec. 5, 1995, the entire disclosure of which is incorporated herein by reference.

The bumping assembly 146 generally comprises a drill seat or anvil 148 which is attached to the top surface 44 of the housing 42. Extending axially through the drill seat 148 is an aperture 150 for slidably receiving the shank portion 18 of a drill bit 16. The diameter of the aperture 150 is sized so as to slightly exceed the diameter of the shank portion 18, thus facilitating the slidable receipt of the shank portion 18 thereinto. In addition to the drill seat 148, the bumping assembly 146 has a reciprocal ram or hammer assembly which includes an enlarged tool head 152. The tool head 152 defines a central aperture 154 extending axially therethrough which is slightly larger in diameter than the aperture 150 extending axially through the drill seat 148. The central aperture 154 of the tool head 152 is coaxially aligned with the aperture 150, and thus in coaxial alignment with the longitudinal axis of a drill bit 16 inserted into the drill seat 148.

As seen in FIG. 9, the distal portion of the central aperture 154 is enlarged in size to partially receive the locating ring 22 positioned upon a drill bit 16. In this respect, the diameter of the enlarged portion slightly exceeds the diameter of the locating ring 22, with the depth D2 of the enlarged portion being slightly less than the width W1 of the locating ring 22. As further seen in FIG. 9, the enlargement of the distal portion of the central aperture 154 facilitates the formation of an annular bumping surface 156 which circumvents the reduced diameter portion of the central aperture 154, and is adapted to contact the locating ring 22. As will be described in more detail below, when a drill bit 16 is inserted into the drill seat 148 and the ram assembly is actuated to facilitate the downward movement of the tool head 152, the cutting tip 12, fluted portion 14, tapered region 20 and upper end of the shank portion 18 of the drill bit 16 are received into the central aperture 154, with the locating ring 22 being "bumped" by the bumping surface 156 so as to force the locating ring 22 into abutting contact with the top surface 158 of the drill seat 148.

The bumping assembly 146 further comprises an adjustment mechanism for positioning the cutting tip 12 of a drill bit 16 inserted into the drill seat 148 at a desired separation distance SD from the top surface 158 of the drill seat 148.

The adjustment mechanism includes an optical reference system which is adapted to produce a laser beam L which travels perpendicularly relative the longitudinal axis of the drill bit 16 and is spaced from the top surface 158 of the drill seat 148 by the separation distance SD. In addition to the optical reference system, the adjustment mechanism comprises a reversible linear actuator or stepper motor which is disposed within the interior of the housing 42 and includes an elongate lead screw 160 which is selectively extensible from and retractable into the stepper motor. Extending axially from the top end of the lead screw 160 is an elongate, cylindrically configured pin portion 162 which defines a blunt distal end. The diameter of the pin portion 162 is slightly less than the diameter of the aperture 150, thus allowing the pin portion 162 to be slidably extensible into the aperture 150 and vertically moveable therewithin.

In the apparatus 10, the bumping assembly 146 is utilized by initially inserting the shank portion 18 of a drill bit 16 into the aperture 150 of the drill seat 148 via the loader assembly 62. The insertion of the shank portion 18 into the aperture 150 is limited by the abutment of the end 24 thereof against the distal end of the pin portion 162 which, as previously indicated, resides within the aperture 150.

Subsequent to the insertion of the drill bit 16 into the drill seat 148, the optical laser beam L is transmitted horizontally, and more particularly perpendicularly relative the longitudinal axis of the drill bit 16 inserted into the drill seat 148. The laser beam L is oriented so as to be separated from the top surface 158 of the drill seat 148 by the separation distance SD which is preferably the sum of the distance D1 and the width W1 of the locating ring 22. When the drill bit 16 is initially inserted into the drill seat 148, the cutting tip 12 is typically disposed above the level of the laser beam L. As such, since the cutting tip 12 must be positioned at the separation distance SD prior to bumping the locating ring 22, the drill bit 16 must typically be lowered within the drill seat 148 so as to precisely position the cutting top 12 within the laser beam L.

The lowering of the drill bit 16 within the drill seat 148 is accomplished by activating the stepper motor in a manner causing the lead screw 160 to move in a downward vertical direction, which in turn causes the distal end of the pin portion 162 to move downwardly within the aperture 150. Since the bottom end 24 of the shank portion 18 is abutted against the pin portion 162 when the drill bit 16 is initially inserted into the drill seat 148, the downward movement of the pin portion 162 causes the shank portion 18 to be retracted into the drill seat 148, thus lowering the level of the cutting tip 12.

The downward vertical movement of the lead screw 160 is continued to such time as the cutting tip 12 is disposed below the laser beam L. When it is determined that the cutting tip 12 is disposed below the level of the laser beam L (i.e., a continuous laser beam L is transmitted and uninterrupted by the cutting tip 12), the stepper motor is deactivated and the downward vertical movement of the lead screw 160 stopped. Thereafter, the stepper motor is re-energized in a manner facilitating the upward vertical movement of the lead screw 160 and pin portion 162 thereof. The upward movement of the lead screw 160 facilitates the simultaneous upward movement of the cutting tip 12 toward the laser beam L. At the precise moment the cutting tip 12 interrupts the laser beam L, the stepper motor is deactivated, thus resulting in the cutting tip 12 being spaced from the top surface 158 of the drill seat 148 by the separation distance SD.

When the cutting tip 12 is positioned within the laser beam L and thus spaced from the top surface 158 by the separation distance SD, a slight gap will typically be defined between the locating ring 22 and the top surface 158 of the drill seat 148. Thereafter, the ram assembly is actuated to facilitate the rapid downward movement of the tool head 152. As previously indicated, the downward actuation of the tool head 152 results in the locating ring 22 being contacted or "bumped" by the bumping surface 156 defined about the central aperture 154. Importantly, the bumping of the locating ring 22 by the tool head 152 overcomes the frictional or press-fit engagement of the locating ring 22 upon the shank portion 18 of the drill bit 16 and forces the locating ring 22 downwardly into abutting contact with the top surface 158 of the drill seat 148. Once the locating ring 22 is abutted against the top surface 158, it is spaced from the cutting tip 12 at the desired distance D1. The locating ring 22 is preferably bumped twice by the tool head 152, with the first bump being utilized to force the locating ring 22 in abutting contact with the top surface 158, and the second bump being utilized to jettison any residual flash or debris from the locating ring 22.

As seen in FIGS. 2 and 3, the ram assembly of the bumping assembly 146 is movably mounted to a base carriage 164 of the bumping assembly 146 and linearly moveable between extended and retracted positions relative to the drill seat 148. When the ram assembly is in its extended position, the central aperture 154 of the tool head 152 is coaxially aligned with the aperture 150 of the drill seat 148. Conversely, when the ram assembly is actuated to its retracted position (as shown in FIGS. 2 and 3), the same is spaced horizontally away from the drill seat 148, thus providing access to the aperture 150 to allow the loader assembly 62 to insert the drill bit 16 thereinto in the above-described manner.

Apparatus Operation

Having thus described the various assemblies of the apparatus 10, the operation thereof will now be explained with reference to FIGS. 11a–11n. In the apparatus 10, the programmable control device(s) disposed within either or both of the control panels 46 or within the interior of the housing 42 functions to control and coordinate the operations of the loader assembly 62, inversion assemblies 85, workhead assemblies 96, optical assemblies 118, grinding assemblies 130, secondary cleaning assemblies 180, and bumping assembly 146. In this respect, the control device is electrically interfaced to the various components of these assemblies (e.g., first and second stepper motors 104, 112, front and top cameras 126, 128, first and second grinder motors 134, 136), and to auxiliary control devices such as solenoid valves, cylinders and the vacuum pump which are used to facilitate the control of other components of the assemblies.

In the following discussion of the operation of the apparatus 10, the sequence of steps will be described in relation to the re-sharpening of the cutting tip 12 of a drill bit 16 and the re-positioning of the locating ring 22 thereof through the use of one of the cassette trays 54, the loader assembly 62, one of the shaft members 72 of the gripper 70, one of the primary cleaning assemblies 80, one of the inversion assemblies 85, one of the workhead assemblies 96, one of the optical assemblies 118, one of the grinding assemblies 130, one of the secondary cleaning assemblies 180, and bumping assembly 146. However, those of ordinary skill in the art will recognize that since the apparatus 10 includes pairs of primary cleaning, workhead, optical, grinding and secondary cleaning assemblies as well as a pair of shaft members 72 on the gripper 70 and a pair of cassette trays 54, the cutting tip re-sharpening and locating ring re-positioning processes as will hereinafter be described may be conducted simultaneously on at least two drill bits 16, with the control device being specifically adapted to control and coordinate such simultaneous operations.

In using the apparatus 10, a drill bit container 26 including a plurality of drill bits 16 stored therewithin is positioned within an opening 56 of a cassette tray 54, with the cover 30 of the drill bit container 26 being moved to its opened position or removed from the base 28, thus exposing the fluted portions 14 of the drill bits 16 (FIG. 11a). Thereafter, a single drill bit 16 is lifted out of the drill bit container 26 by the loader assembly 62, and in particular a shaft member 72 of the gripper 70 (FIG. 11b). The manner in which the loader assembly 62 functions to grasp and release a drill bit 16 is described above in the section captioned Loader Assembly. As will be recognized, the control device of the apparatus 10 is programmed in a manner which allows the same to maneuver a shaft member 72 of the gripper 70 into axial alignment with any drill bit 16 in a drill bit container 26 stored within any opening 56 of a cassette tray 54.

After being lifted out of the drill bit container 26, when necessary, the drill bit 16 is transported by the loader assembly 62 to an inversion assembly 85, and is inserted by the loader assembly 62 into the holder block 88 of the inversion arm 87 such that the fluted portion 14 is directed generally vertically upwardly (FIG. 11c). The insertion of the drill bit 16 into the holder block 88 is accomplished in the manner previously described in the section captioned Inversion Assemblies. After the drill bit 16 has been inserted into the holder block 88 and the locking pin 89 extended so as to engage the shank portion 18 and lock the drill bit 16 within the holder block 88, the inversion arm 87 is rotated approximately 180° such that the shank portion 18 of the drill bit 16 is directed generally vertically upwardly. The drill bit 16 is then removed from within the holder block 88 by the loader assembly 62 in the manner also previously described in the section captioned Inversion Assemblies.

After the drill bit 16 has been removed from within the holder block 88 of an inversion assembly 85, the drill bit is transported by the loader assembly 62 to a primary cleaning assembly 80, with the cutting tip 12 then being inserted into and removed from within the cleaning putty 84 via the loader assembly 62 to facilitate the cleaning thereof in the manner previously described in the section captioned Primary Cleaning Assemblies. The drill bit is then transported back to an inversion assembly 85 and inserted by the loader assembly 62 into the holder block 88 such that the shank portion 18 is directed generally vertically upwardly. Once again, the insertion of the drill bit 16 into the holder block 88 is accomplished in the manner previously described in the section captioned Inversion Assemblies. After the drill bit 16 has been inserted into the holder block 88 and the locking pin 89 extended so as to engage the shank portion 18 and lock the drill bit 16 within the holder block 88, the inversion arm 87 is rotated approximately 180° such that the fluted portion 14 is directed generally vertically upwardly. The drill bit 16 is then re-grasped by the loader assembly 62 and removed from within the holder block 88 of the inversion assembly 85 (FIG. 11e) in the manner previously described in the section captioned Inversion Assemblies.

As previously explained, if the drill bit 16 is initially oriented within the drill bit container 26 such that the shank portion 18 rather than the fluted portion 14 thereof is directed generally vertically upwardly, the step of inverting or flipping the drill bit 16 prior to the initial cleaning of the cutting tip 12 thereof as shown and described in relation to FIG. 11c is eliminated since the fluted portion 14 (as opposed to the shank portion 18) already protrudes from the shaft member 72. In this respect, the operational sequence of the apparatus 10 proceeds directly from the removal of the drill bit 16 from within the drill bit container 26 as shown and described in relation to FIG. 11b to the cleaning of the cutting tip 12 in the manner shown and described in relation to FIG. 11d. The inversion step conducted subsequent to the initial cleaning of the cutting tip 12 as shown and described in relation to FIG. 11e must always be completed irrespective of the initial orientation of the drill bit 16 within the drill bit container 26.

After the drill bit 16 has been lifted out of the holder block 88, the actuator member 78 of the gripper 70 is activated so as to rotate the shaft members 72 upwardly in a manner causing the drill bit 16 to extend along the gripper axis GX (FIGS. 4a and 11f). The loader assembly 62 is then maneuvered so as to axially align the gripper axis GX with the collet axis CX of a workhead assembly 96. Subsequent to such alignment, the shank portion 18 of the drill bit 16 is horizontally advanced into the collet head 110 of the collet member 106 of the workhead assembly 96 and locked therein (FIG. 11g).

When the drill bit 16 is initially inserted into the collet head 110, the orientation of the swivel member 102 and hence the collet member 106 of the workhead assembly 96 is such that the collet axis CX is coaxially aligned with the opening 122 within the optical housing 120 of an optical assembly 118. The actuator 100 of the workhead assembly 96 is then activated to cause the retraction of the piston rod into the body, thus resulting in the movement of the base member 98 of the workhead assembly 96 along the base member axis BX toward the optical assembly 118. Such movement is continued until such time as the fluted portion 14 and cutting tip 12 of the drill bit 16 are properly positioned within the interior of the optical housing 120 of the optical assembly 118 (FIGS. 7 and 11h).

Referring now to FIGS. 7a–7d, the movement of the drill bit 16 into the optical assembly 118 causes the control device to trigger the performance of a verification of the identity and geometry of the drill bit 16 and the initial inspection or evaluation of the fluted portion 14 and cutting tip 12 by the optical assembly 118. As will discussed in more detail below, the optical assembly 118 is provided with control logic having unique operative capabilities in relation to the inspection or evaluation and measurement of the cutting tip 12 of the drill bit 16. In the apparatus 10, each optical assembly 118 is in electrical communication with the control device for purposes of transmitting data pertaining to such evaluations and measurements thereto so as to provide the apparatus 10 of the present invention with statistical process control (SPC) capability. The electrical communication between the control logic of the optical assembly 118 and the control device of the apparatus 10 also allows for the selective activation and deactivation of the actuator 100 and first and second stepper motors 104, 112 of the corresponding workhead assembly 96 as is needed to facilitate the indexing of the cutting tip 12 within the optical assembly 118 in a prescribed manner which will also be discussed in more detail below.

Referring now FIG. 7a, during the set-up of the apparatus 10, the overall length (OAL) of the drill bit 16 as new is known and programmed or inputted into the control device. As the cutting tip 12 and fluted portion 14 of the drill bit 16 are being advanced into the interior of the optical assembly 118, the top camera 128 thereof begins generating images of the cutting tip 12 and the fluted portion 14 for purposes of allowing the same to be oriented in a prescribed manner relative to various reference points established by the control logic of the optical assembly 118. More particularly, as seen FIGS. 7a–7d, the control logic of the optical assembly 118 is operative to produce a first set of cross-hairs consisting of a first reference axis RA1 and a second reference axis RA2 which extend perpendicularly relative to each other and are superimposed on the images generated by the top camera 128. As seen in FIGS. 7a and 7c, the first set of cross-hairs are generated by the control logic of the optical assembly 118 such that the second reference axis RA2 extends in parallel relation to the collet axis CX. Thus, as the drill bit 16 is advanced into the optical assembly 118, the cutting tip 12 is advanced along the second reference axis RA2.

As indicated above, the overall length of a new drill bit 16 is known and inputted into the control device of the apparatus 10. When the drill bit 16 is initially advanced into the optical assembly 118, the control device, using the data transmitted thereto from the optical assembly 118, is operative to continue the movement of the base member 98 of the workhead assembly 96 along the base member axis BX until such time as the chisel edge 200 of the cutting tip 12 of a new drill bit 16 would be disposed at the point at which the first and second reference axes RA1, RA2 intersect. However, as seen in FIG. 7a, since the apparatus 10 is adapted for use in re-sharpening drill bits, the drill bit 16 advanced into the optical assembly 118, due to its prior usage, will typically not be of the same overall length as a new drill bit 16, but rather slightly shorter in length. Thus, when the movement of the work assembly 96 along the base member axis BX is stopped or discontinued, the chisel edge 200 of the cutting tip 12 will typically fall short of the intersection point between the first and second reference axes RA1, RA2 due to the reduced length of the fluted portion 14 attributable to the prior usage of the drill bit 16.

After the movement of the workhead assembly 96 has been discontinued, the control logic of the optical assembly 118 is operative to measure or determine the distance DL separating the chisel edge 200 of the cutting tip 12 from the intersection point between the first and second reference axes RA1, RA2. This distance DL as determined by the optical assembly 118 is transmitted to the control device, thus allowing the control device to calculate the actual overall length of the drill bit 16 within the optical assembly 118. The actual overall length is derived by subtracting the distance DL from the new drill length measurement previously input into the control device. The calculated actual overall length of the drill bit 16 is stored within the control device of the apparatus 10. Subsequent to this calculation of the overall length of the drill bit 16, the control device of the apparatus 10 re-initiates the movement of the workhead assembly 96 along the base member axis BX. More particularly, the workhead assembly 96 is caused to move the drill bit 16 through the distance DL so as to place the chisel edge 200 of the cutting tip 12 at the intersection point of the first and second reference axis RA1, RA2.

Referring now to FIG. 7b, after the cutting tip 12 of the drill bit 16 has been indexed forwardly by the control device in the above-described manner, images of the cutting tip 12 of the drill bit 16 are then generated by the front camera 126 of the optical assembly 118. The control logic of the optical assembly 118 is further operative to generate a second set of cross-hairs consisting of a generally horizontal third reference axis RA3 and a generally vertical fourth reference axis RA4 which extend perpendicularly relative to each other and are superimposed on the images generated by the front camera 126. The second set of cross-hairs are produced by the control logic of the optical assembly 118 such that the intersection point between the third and fourth reference axis RA3, RA4 is oriented upon the collet axis CX. As is seen in FIG. 7b, the control logic of the optical assembly 118 is further operative to determine or measure the diameter D of the drill bit 16 through the use of the images generated by the front camera 126. The diameter D as determined by the control logic of the optical assembly 118 is transmitted to and stored within the control device of the apparatus 10. Additionally, as seen in FIG. 7d, by using or focusing on the primary faces or facets 204 of the cutting tip 12, the control logic of the optical assembly 118 is operative to establish a reference line RL which extends generally along the straight sections of the cutting edges 202 of the cutting tip 12.

Subsequent to the establishment of the reference line RL, the control logic of the optical assembly 118 is operative to determine or measure the angle A between the reference line RL and the third reference axis RA3 of the second set of cross-hairs. The measured angle A is transmitted to and stored within the control device along with the measurement of the diameter D and previously calculated overall length of the drill bit 16. It is preferred that the angle A be less than 90 degrees. If the angle A is determined to be outside of this desired range, the control device is operative to facilitate the rotation of the collet shaft 108 and hence the collet head 110 via the second stepper motor 112, thus resulting in the rotation of the drill bit 16 relative to the collet axis CX. The rotation of the drill bit 16 relative to the collet axis CX is continued until it is determined by the control logic of the optical assembly 118 that the angle A is within the desired range. Once the angle A is within the desired range, the specific measurement thereof is transmitted to and stored within the control device.

Referring now to FIG. 7c, subsequent to the measurement of the angle A, images are once again generated by the top camera 128 of the optical assembly 118. Based on these generated images, the control logic of the optical assembly 118 is operative to identify the margins of the drill bit 16, and to establish or generate a target line TL which extends generally along one of the margins and over the distal end or edge thereof defined at the cutting tip 12. In addition to the target line TL being produced by the control logic of the optical assembly 118, the images generated by the top camera 128 are used to cause the control device to facilitate a slight incremental movement of the workhead assembly 96 along the base member axis BX. More particularly, the drill bit 16 is moved forwardly along the second reference axis RA2 until it is determined by the control logic of the optical assembly 118 that the first reference axis RA1 extends generally along the distal ends or edges of both margins of the drill bit 16. Thereafter, the control device is operative to facilitate the rotation of the collet shaft 108 and hence the drill bit 16 relative to the collet axis CX, with such rotation being continued until the target line TL crosses or intersects the point of intersection between the first and second reference axes RA1, RA2 of the first set of cross-hairs. It is contemplated that in addition to generating the target line TL relative to one of the margins of the drill bit 16, the control logic of the optical assembly 118 will further be operative to conduct an initial evaluation of the condition of the margins of the drill bit 16, and in particular the portions thereof adjacent the cutting tip 12. Data corresponding to this initial evaluation will be transmitted to and stored within the control device.

As will be recognized, the rotation of the drill bit 16 to facilitate the passage of the target line TL across the point of intersection of the first and second references axes RA1, RA2 of the first set of cross-hairs will result in a change to the previously measured angle A. However, the control device of the apparatus 10, working in conjunction with the control logic of the optical assembly 118, is able to calculate the new angle A of the reference line RL relative to the third reference axis RA3 resulting from the rotation of the drill bit 16 in accordance with the step shown in FIG. 7c. As is discussed below, the stored new angle A is used as a baseline setting to facilitate the later adjustment of the angle A as is needed to facilitate the proper engagement of the cutting tip 12 to the grinding assembly 130 and the proper illumination of the cutting 12 within the optical assembly 118 during the final inspection or evaluation thereof.

The adjustments to the angular orientation of the cutting tip 12 as may be used to establish the angle A in the desired range and/or the extension of the target line TL through the point of intersection of the first and second reference axis RA1, RA2 is preferably accomplished through a first rough rotation of the collet shaft 108 of the workhead assembly 96, which is immediately followed a fine rotation thereof. Importantly, the workhead assembly 96, and more particularly the second stepper motor 112 thereof, is operable to provide positional accuracy to the angular orientation of the cutting tip 12 to within about 0.000005 inches.

It is contemplated that if either the calculated overall length measurement of the drill bit 16 or the diameter D thereof is initially determined to be outside of specified tolerances, the drill bit 16 will immediately be rejected from further processing. Similarly, if the initial evaluation of the margin condition of the drill bit 16 demonstrates that one or both of the margins are outside of a prescribed tolerance, the drill bit 16 will be rejected from further processing within the apparatus 10. Thus, in the apparatus 10 of the present invention, the drill bit 16, and in particular the cutting tip thereof, is subjected to various initial qualifications, and is rejected prior to any re-grinding if such initial qualifications are not properly satisfied. Thus, as indicated above, a parameter such the actual overall length of the drill bit 16 may be used to determine whether the cutting tip 12 thereof should be re-ground or whether the drill bit 16 should be thrown-out.

As explained above, the control logic of the optical assembly 118 is operable to process and interpret the images generated by the front and top cameras 126, 128. Due to the optical assembly 118 being in electrical communication with the control device and operative to transmit data corresponding to the images generated by the front and top cameras 126, 128 thereto, the control device is able to regulate the movement of the workhead assembly 96 (i.e., the movement of the base member 98 along the base member axis BX and/or the rotation of the collet shaft 108 about the collet axis CX) in response to such data as is needed to accomplish the indexing and adjustment steps described in relation to FIGS. 7a–7d. As also indicated above, the data obtained from the initial evaluation of the drill bit 16 (i.e., the overall length, diameter D, angle A and margin condition) is stored within the control device for future reference and for purposes of updating the artificial intelligence of the control device. During the initial evaluation process, the fluted portion 14 and cutting tip 12 of the drill bit 16 are properly illuminated via the illumination array 124 of the optical assembly 118.

Subsequent to the completion of the initial evaluation of the drill bit 16, the same is retracted out of the optical assembly 118 by the workhead assembly 96 and transported to a grinding assembly 130 thereby. As indicated above, the angle A between the reference line RL and third reference axis RA3 is determined by the control logic of the optical assembly 118 through the use of the images generated by the front camera 126, with the angle A being transmitted to and stored within the control device. Upon the retraction of the drill bit 16 out of the optical assembly 118, the control device is operative to facilitate the rotation of the drill bit 16 relative to the collet axis CX such that the angle A is set to about 72 degrees. Importantly, the angle A is set to 72 degrees so as to facilitate the engagement of the cutting tip 12 to the grinding assembly 130 at the proper angular orientation, as will be described in more detail below.

The process of transporting the drill bit 16 to the grinding assembly 130 is accomplished by the activation of the actuator 100 to cause the extension or advancement of the piston rod from the body which results in the movement of the base member 98 of the workhead assembly 96 along the base member axis BX away from the optical assembly 118. The swivel member 102 of the workhead assembly 96 is then rotated by the activation of the first stepper motor 104 so as to place the cutting tip 12 of the drill bit 16 at the proper angular orientation relative to the grinding face of the first grinder head 138 of the grinder assembly 130 based on the initial evaluation thereof. The collet shaft 108 of the collet member 106 of the workhead assembly 96 is then indexed toward the grinding assembly 130 by the activation of the second stepper motor 112. The movement of the collet member 108 is controlled so as to place the cutting tip 12 of the drill bit 16 into contact with the rotating grinding face of the first grinder head 138 (FIG. 11i). Importantly, as previously indicated, as the cutting tip 12 of the drill bit 16 is being advanced toward the grinder head 138, the locking sleeve 111 is received into the aperture or support bushing 116 of the support member 114 of the workhead assembly 96. Such receipt prevents excessive vibration and or movement of the collet head 110 and hence the cutting tip 12 of the drill bit 16 as the same is being ground.

After the cutting tip 12 has been placed into contact with the grinding face of the first grinder head 138, the second stepper motor 112 is activated so as to facilitate a slight retraction of the collet shaft 108 into the collet member housing 107 for purposes of creating a narrow gap between the cutting tip 12 and the grinding face. Thereafter, the second stepper motor 112 is activated so as to cause the collet shaft 108 to rotate the drill bit approximately 180°. Subsequent to such rotation, the second stepper motor 112 is activated so as to once again facilitate the advancement of the collet shaft 108 from the collet member housing 107 and return the cutting tip 12 of the drill bit 16 into contact with the grinding face. As will be recognized, this procedure must be followed to achieve the sharpening of both flutes of the cutting tip 12.

After both flutes of the cutting tip 12 have been re-sharpened by the grinding face of the first grinder head 138, the same process as described above is repeated in relation to the grinding face of the second grinder head 140. In this respect, the cutting tip 12 of the drill bit 16 is advanced by a workhead assembly 96 into contact with the rotating grinding face of the second grinder head 140, retracted therefrom and rotated approximately 180°, and subsequently advanced back into contact with the grinding face of the second grinder head 140. During the complete grinding process, the grinding of the cutting tip 12 via the grinding face of the first grinder head 138 accomplishes a "rough" grind, with the grinding of the cutting tip 12 via the grinding face of the second grinder head 140 accomplishing a "fine" grind.

As will be recognized, the advancement of the cutting tip 12 of the drill bit 16 into contact with the rotating grinding face of either the first or second grinder heads 138, 140 by a workhead assembly 96 results in a certain amount of pressure being exerted by the cutting tip 12 against a respective grinding face. The advancement of the cutting tip 12 into contact with the grinding face too quickly or with too much force, or the exertion of excessive pressure by the cutting tip 12 against the grinding face during the grinding operation after initial contact has been established could result in the fracture of breakage of the drill bit 16 or the burning of the cutting tip 12 thereof. To eliminate such susceptibility to breakage or burning, each grinding assembly 130 of the apparatus 10 may be outfitted with the above-described adjustment mechanisms 300.

Importantly, each of the adjustment mechanisms 300 is operative to retract a respective grinding face away from the cutting tip 12 of the drill bit 16 in the event the pressure exerted by the cutting tip 12 thereagainst exceeds a prescribed level. For example, in the adjustment mechanism 300 shown in FIG. 13, the exertion of compressive pressure by the cutting tip 12 against the grinding face of the first grinder head 138 above a prescribed level would trigger the activation of the stepper motor 306 to facilitate the rotation of the ball screw 304 in a manner resulting in the movement of the first grinder head 138 along the grinder head axis GH toward the stepper motor 306, and hence away from the cutting tip 12 of the drill bit 16. As will recognized, such rearward movement of the first grinder head 138 alleviates the excessive pressure condition which could otherwise result in the fracture of burning of the cutting tip 12. The determination of whether the pressure exerted by the cutting tip 12 against the grinding face of the first grinder head 138 exceeds the prescribed level is established by a suitable transducer element disposed within the first grinder motor 134 and cooperatively engaged to the first motor shaft 135. This transducer element is in electrical communication with the stepper motor 306 and, as indicated above, causes the first grinder head 138 to be retracted away from the cutting tip 12 in response to an excessive pressure condition. In the event the retraction of the first grinder head 138 away from the cutting tip 12 results in the pressure level falling below an acceptable or tolerable range, the stepper motor 306 will be re-activated to facilitate to the movement of the first grinder head 138 in an opposite direction toward the cutting tip 12 so as to re-establish contact therebetween at a pressure level within the acceptable range.

It will be recognized that the same functionality is achieved in relation to the second grinder head 140 by mounting the second grinder motor 136 to the remaining adjustment mechanism 300. Like the first grinder motor 134, the second grinder motor 136 may include a pressure transducer element which is cooperatively engaged to the associated motor shaft facilitating the rotatable connection of the second grinder head 140 to the second grinder motor 136. It is contemplated that in the apparatus 10 of the present invention, the initial evaluations/measurements of the drill bit 16 and cutting tip 12 thereof facilitated by the optical assembly 118 and control device may be used to cause the control device to manipulate the workhead assembly 96 in manner allowing the re-grinding operation to be completed in a manner wherein the overall length of the drill bit 16 is reduced by only about 0.002 inches. This level of accuracy is a significant improvement over prior art re-sharpening devices of lesser accuracy wherein the re-grinding process typically results in a reduction in overall length of about 0.008 inches, thus significantly reducing the life span of the drill bit.

After the cutting tip 12 has been re-sharpened by the grinding assembly 130, the drill bit 16 is then maneuvered by the workhead assembly 96 such that the collet axis CX is coaxially aligned with the opening 122 within the optical housing 120 of an optical assembly 118. The conveyor bar 184 of a secondary cleaning assembly 180 is then actuated from its retracted to its extended position, thus resulting in the placement of a quantity of cleaning putty 194 on the conveyor belt 190 into horizontal alignment with the cutting tip 12 of the drill bit 16. Thereafter, the actuator 100 of the workhead assembly 96 is actuated so as to cause the retraction of the piston rod into the body, thus resulting in the movement of the base member 98 of the workhead assembly 96 along the base member axis BX toward the optical assembly 118. Such movement is continued until such time as the cutting tip 12 is inserted into the quantity of cleaning putty 194 upon the conveyor belt 190 of the secondary cleaning assembly 180 (FIG. 11*j*). Subsequent to such insertion, the conveyor bar 184 is actuated back to its retracted position, thus resulting in the removal of the cutting tip 12 from within the quantity of cleaning putty 194.

As previously explained in the section captioned Secondary Cleaning Assemblies, the return of the conveyor bar 184 to its retracted position results in the indexing of the conveyor belt 190 a prescribed incremental distance which insures that the cutting tips 12 of subsequently cleaned drill bits 16 will not be inserted into the same portion of cleaning putty 194 as the previously cleaned drill bits 16. After the cutting tip 12 of the drill bit 16 has been re-cleaned, the drill bit 16 is re-inserted into the optical assembly 118 (FIG. 11*k*), with such insertion being accomplished in the same manner previously described in relation to FIG. 11*h*. After being cleaned but prior to being re-inserted into the optical assembly 118, the drill bit 16 is rotated by the workhead assembly 96 relative to the collet axis CX so as to set the angle A to 160 degrees or 20 degrees. As will be recognized, the control device is operative to facilitate such precise rotation of the drill bit 16 due to the original value of the angle A being stored therein. Importantly, the rotation of the drill bit 16 such that the angle A equals 160 degrees or 20 degrees is used to optimize the illumination of the cutting tip 12 thereof by the illumination ray 124 when the drill bit 16 is re-inserted into the optical assembly 118, for reasons which will be discussed in more detail below.

Referring now to FIG. 10*a*–10*c*, the re-insertion of the drill bit 16 into the optical assembly 118 causes the control device to trigger the performance of a final inspection or evaluation of the cutting tip 12 and fluted portion 14 thereof. More particularly, immediately upon the drill bit 16 being re-inserted into the optical assembly 118, the top camera 128 begins generating images which allow the control logic of the optical assembly 118 to interact with the control device in a manner causing the chisel edge 200 of the cutting tip 12 to be brought to the point of intersection between the first and second reference axis RA1, RA2 of the first set of cross-hairs. The advancement of the chisel edge 200 to this point of intersection allows the optical assembly 118 to determine whether the drill bit 16 has been broken during the grinding or re-sharpening process. In this respect, if the drill bit 16 has been broken, the images generated by the top camera 128 will establish that at least a portion of the fluted portion 14 including the cutting tip 12 is missing from the drill bit 16.

Assuming that the drill bit 16 has not been broken as a result of the check thereof by the optical assembly 118, the process previously described in relation to FIG. 7*a* is repeated for purposes of determining or measuring the new overall length of the drill bit 16. In this respect, since the grinding process typically results in the shortening of the fluted portion 14, the comparison of the new overall length of the drill bit 16 to the previously stored measurement thereof allows for a determination as to how much of the fluted portion 14 has been removed by the grinding process. The new overall length of the drill bit 16 calculated subsequent to the completion to the re-grinding of the cutting tip 12 thereof is also transmitted to and stored within the control device.

Subsequent to the determination of the new overall length of the drill bit 16, the front camera 126 then generates images which are used to inspect or check the geometry and condition of the cutting tip 12 (FIG. 10*b*). As seen in FIGS. 10*c* and 12*a*–12*j*, the control logic of the optical assembly 118 is operative to interpret and evaluate the images generated by the front camera 126 regarding the geometry and condition of the cutting tip 12, and to electrically communicate data corresponding to such evaluation to the control device for storage therein. Importantly, the highly sophisticated level of functionality of the optical assembly 118, and in particular the control logic thereof, allows for a determination of various conditions of the cutting tip 12, including:

1. the final margin condition of the fluted portion 14 (FIG. 10*c*);
2. relatively minor, non-functional conditions including an overlap condition which can impede the drill bit 16 from centering correctly (FIG. 12*a*), a gap condition which is typically considered to be a non-functional condition of the drill bit 16 (FIG. 12*b*), a negative condition which is typically considered to be a non-functional defect with no impact on the cutting action or symmetry of the drill bit 16 when held within the specification (FIG. 12*c*), a flare condition which is typically considered to be a non-functional cosmetic defect (FIG. 12*d*), and a hook condition which is typically considered to be a non-functional condition which could result in premature wear of the cutting tip 12 (FIG. 12*i*); and
3. critical cutting edge conditions, including chips on the primary cutting edges 202 of the cutting tip 12 which prevent the drill bit 16 from cutting cleaning and efficiently (FIG. 12*e*), a lay back condition (also referred to as negative rake) which allows the centers of the cutting edges 202 to be the leading cutting edges of the cutting tip 12 verses the corner edges thereof (FIG. 12*f*), an offcenter condition which is characterized by a non-centralized chisel edge 200 and allows for non-concentric drilling to occur (FIG. 12*g*), and an offset condition which is defined by a off-centered center line CL of the cutting tip 12 (i.e., primary faces 204 of different thicknesses) and allows for non-concentric drilling to occur (i.e., holes out-of-round or mis-registered) (FIG. 12*h*).

Once again, the control device is operable to process and interpret the images generated by the front and top cameras 126, 128, and store the data obtained from the final evaluation for verification of tolerances, for future reference, and for updating the artificial intelligence of the control device. If through this final inspection, the drill bit 16 is determined to be outside of process tolerances, the drill bit is rejected from further processing at this time or re-evaluated for additional re-sharpening procedures. In this respect, the failure of the drill bit 16 to satisfy prescribed parameters as determined during the final evaluation thereof could be used to trigger the initiation of a re-grinding operation in relation thereto. As part of the final evaluation, a determination is made by the control device as to whether the position of the locating ring 22 upon the shank portion 18 must be adjusted due to the shortening of the fluted portion 14 resulting from the grinding process. As indicated above, the re-sharpening of the cutting tip 12 (i.e., the grinding process), will typically necessitate the re-positioning of the locating ring 22 upon the shank portion 18 of the drill bit 16. It is contemplated that the drill bit 16 may be provided with some type of last use indicator adjacent the locating ring 22 for providing a visual indication that the drill bit 16 should not be subjected to another re-grinding operation.

Upon completion of the final evaluation, the drill bit 16 is transferred from the workhead assembly 96 back to the loader assembly 62 (FIG. 11*l*). As will be recognized, this process is accomplished in the reverse manner to that previously described in relation to FIG. 11*g*. Since the gripper 70 includes a pair of shaft members 72, a drill bit 16 can be removed from within a workhead assembly 96 and another drill bit 16 (i.e., the drill bit 16 disposed within the remaining shaft member 72) inserted into the workhead assembly 96 without having to maneuver the gripper 70 back to one of the cassette trays 54. If, during the final evaluation of the drill bit 16 it is determined that the geometry of the cutting tip 12 is flawed or faulted, upon the drill bit 16 being transferred back to the loader assembly 62, the same is immediately transported by the loader assembly 62 to a reject bin or similar location. Assuming that the cutting tip 12 is not flawed and the locating ring 22 must be re-positioned, the loader assembly 62 then transports the drill bit 16 to the bumper assembly 146, and inserts the shank portion 18 of the drill bit 16 into the drill seat 148 of the bumping assembly 146 (FIG. 11*m*). The re-positioning of the locating ring 22 of the drill bit 16 by the bumping assembly 146 is accomplished in the manner previously described in the section captioned Bumping Assembly.

After the locating ring 22 has been re-positioned via the bumping assembly 146, the drill bit 16 is transported back to a cassette tray 54 by the loader assembly 62. Importantly, the loader assembly 62 is maneuvered by the control device so as to return the drill bit 16 to the precise drill bit receiving hole 40 within the drill bit container 26 from which it was initially removed by the loader assembly 62 (FIG. 11*n*), thus re-packaging the drill bit 16 within the container 26.

Statistical Process Control

As indicated above, for each drill bit 16 re-sharpened by the apparatus 10 of the present invention, data corresponding to the geometry and condition of the drill bit 16, and in particular the cutting tip 12 thereof, is transmitted to the control device and stored therewithin. This data is generated by the control logic of the optical control assembly 118 based on the images generated by the front and top cameras 126, 128 thereof. The transmission of this data to the control device by virtue of its electrical communication with the optical assembly 118 allows the control device to manipulate the various linear and/or rotational movements of the workhead assembly 96 as needed to facilitate the required indexing of the drill bit 16, and in particular the cutting tip 12 thereof, within the interior of the optical assembly 118 for proper illumination, inspection and evaluation.

Typically, the apparatus 10 of the present invention will be used to re-sharpen large lots of the drill bits 16. Importantly, the control device is provided with memory or storage capacity sufficient to allow for the storage of the above-described information for each individual drill bit 16 of the lot to be re-sharpened through the use of the apparatus 10. As indicated above, the data for each drill bit 16 stored within the control device includes its pre-grinding overall length, pre-grinding diameter, pre-grinding margin condition, post-grinding overall length, post-grinding margin condition, and post-grinding geometry/condition of the cutting tip 12. Advantageously, the control device has the capability of accumulating this data for the entire lot of drill bits 16 being re-sharpened by the apparatus 10, and to provide a print-out of such data to provide to the customer. The data presented to the customer in print-out form is lot specific. This data not only provides a verification of the accuracy of the re-grinding process, but also apprises the customer with a used drill analysis (UDA). In this respect, the data provided in the print-out may be used to advise the customer that the drill bits 16 are being re-sharpened too early, and that the same may be subjected to further use before re-sharpening is necessary. This data can also be used to determine whether the stock removal from the cutting tips 12 of the drill bits 16 should be reduced, whether the stock removal from the cutting tips 12 of the drill bits 16 should be increased, and whether the speed of the first and second grinder motors 134, 136 should be increased or decreased. This data can further be used to facilitate the sorting of the drill bits 16 in a desired manner. For example, drill bits 16 within a certain overall length range may be sorted or segregated to a prescribed location, with drill bits 16 having cutting tips 12 of a similar condition being sorted into a prescribed location.

Additional modifications and improvements of the present invention may also be apparent to those of ordinary skill in the art. Thus, the particular combination of parts and steps described and illustrated herein is intended to represent only one embodiment of the present invention, and is not intended to serve as limitations of alternative devices within the spirit and scope of the invention.

What is claimed is:

1. An automated method of re-sharpening a drill bit having a shank portion and a fluted portion which defines a pair of margins and a cutting tip using an automated re-sharpening apparatus which includes at least one grinding assembly, at least one workhead assembly, and a loader assembly, the method comprising the steps of:
    a) positioning at least one drill bit at a pick-up location;
    b) removing the drill bit from the pick-up location via the loader assembly;
    c) transferring the drill bit from the loader assembly to the workhead assembly;
    d) rotating the cutting tip into a prescribed angular orientation via the workhead assembly;
    e) moving the cutting tip into contact with the grinding assembly via the workhead assembly; and
    f) transferring the drill bit from the workhead assembly to a drop-off location via the loader assembly.

2. The method of claim 1 wherein:
    step (a) comprises positioning multiple drill bits at the pick-up location;
    step (b) comprises removing the drill bits from the pick-up location one at a time via the loader assembly; and
    step (f) comprises transferring the drill bits from the workhead assembly to the drop-off location one at a time via the loader assembly.

3. The method of claim 1 wherein step (d) comprises:
    g) conducting an evaluation of the drill bit via an optical assembly.

4. The method of claim 1 further comprising the step of:
   g) indexing the cutting tip to a prescribed position via the workhead assembly.

5. The method of claim 1 further comprising the steps of:
   g) moving the cutting tip away from the grinding assembly via the workhead assembly;
   h) rotating the cutting tip approximately 180° via the workhead assembly;
   i) moving the cutting tip into contact with the grinding assembly via the workhead assembly; and
   j) moving the cutting tip away from the grinding assembly via the workhead assembly.

6. An automated method of re-sharpening a drill bit having a shank portion and a fluted portion which defines a pair of margins and a cutting tip using an automated re-sharpening apparatus which includes at least one grinding assembly and at least one workhead assembly including a support member, the method comprising the steps of:
   a. advancing the shank portion of the drill bit into the workhead assembly;
   b. rotating the cutting tip into a prescribed angular orientation via the workhead assembly;
   c. inserting the drill bit into the support member of the workhead assembly; and
   d. moving the cutting tip into contact with the grinding assembly via the workhead assembly.

7. The method of claim 6 further comprising the step of indexing the cutting tip to a prescribed position via the workhead assembly.

8. The method of claim 6 further comprising the steps of:
   e. moving the cutting tip away from the grinding assembly via the workhead assembly;
   f. rotating the cutting tip approximately 180° via the workhead assembly;
   g. moving the cutting tip into contact with the grinding assembly via the workhead assembly; and
   h. moving the cutting tip away from the grinding assembly via the workhead assembly.

9. The method of claim 6 further comprising the step of conducting an evaluation of the drill bit via an optical assembly.

* * * * *